United States Patent
Engelhardt

(10) Patent No.: US 9,679,773 B1
(45) Date of Patent: Jun. 13, 2017

(54) METHOD FOR THERMAL ANNEALING AND A SEMICONDUCTOR DEVICE FORMED BY THE METHOD

(71) Applicant: Infineon Technologies AG, Neuibiberg (DE)

(72) Inventor: Manfred Engelhardt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/068,762

(22) Filed: Mar. 14, 2016

(51) Int. Cl.
| | |
|---|---|
| H01L 21/02 | (2006.01) |
| H01L 21/225 | (2006.01) |
| H01L 21/268 | (2006.01) |
| C01B 31/02 | (2006.01) |

(52) U.S. Cl.
CPC .......... *H01L 21/225* (2013.01); *C01B 31/022* (2013.01); *H01L 21/268* (2013.01); *C01B 2202/22* (2013.01)

(58) Field of Classification Search
CPC ................. H01L 21/225; H01L 21/268; H01L 21/02115; C01B 31/022
USPC ........................................................ 257/655
See application file for complete search history.

(56) References Cited

U.S. PATENT DOCUMENTS

| | | | | |
|---|---|---|---|---|
| 2005/0074986 A1* | 4/2005 | Autryve | ............. | H01L 21/0276 438/795 |
| 2008/0081471 A1* | 4/2008 | Press | ..................... | H01L 21/268 438/682 |
| 2008/0181839 A1* | 7/2008 | Arendt | ................... | B82Y 30/00 423/447.2 |
| 2012/0126342 A1* | 5/2012 | Cheng | ................. | H01L 29/4983 257/408 |
| 2014/0145272 A1* | 5/2014 | Or-Bach | ............ | H01L 27/0688 257/369 |
| 2015/0337224 A1* | 11/2015 | Stiegman | .................. | C10J 3/02 252/373 |
| 2016/0101433 A1* | 4/2016 | Bruck | ................. | B05D 3/0218 428/670 |

OTHER PUBLICATIONS

"Annual Report 2011", Frauenhofer Institute for Electronic Nano Systems ENAS, 65 pages (http://www.enas.fraunhofer.de/content/dam/enas/de/documents/Downloads/Jahresberichte/ENAS_AnnualReport_2011_web.pdf).

* cited by examiner

*Primary Examiner* — Tu-Tu Ho
(74) *Attorney, Agent, or Firm* — Viering, Jentschura & Partner mbB

(57) ABSTRACT

According to various embodiments, a method may include: disposing a dopant in a semiconductor region; forming a radiation absorption layer including or formed from at least one allotrope of carbon over at least a portion of the semiconductor region; and activating the dopant at least partially by irradiating the radiation absorption layer at least partially with electromagnetic radiation to heat the semiconductor region at least partially.

23 Claims, 17 Drawing Sheets

METHOD FOR THERMAL ANNEALING AND A SEMICONDUCTOR DEVICE FORMED BY THE METHOD

TECHNICAL FIELD

Various embodiments relate generally to a method for thermal annealing and a semiconductor device formed by the method.

BACKGROUND

In general, semiconductor materials may be processed in semiconductor technology on or in a substrate (also referred to as a wafer or a carrier), e.g. to fabricate integrated circuits (also referred to as chips). During processing the semiconductor material, certain process steps may be applied, such as thinning the substrate, doping a semiconductor material, or forming one or more layers over the substrate.

For doping the semiconductor material, a dopant may be implanted into the semiconductor material. The semiconductor material may be further processed to fully activate the dopant. Dopant activation may provide obtaining the desired electronic contribution from the dopant in the semiconductor material. For activating the dopant, thermal energy may be transferred to the semiconductor material following the dopant implantation. Conventionally, thermal annealing by a furnace or rapid thermal processing is used, providing a thermal equilibrium or a rapid process, with a high peak temperature for less than one second to minimize chemical diffusion of the dopant. For transferring thermal energy to the semiconductor material, laser light may be used, also referred to as Laser-Thermal Annealing (LTA).

Conventionally, a wavelength of the laser light is adapted according to the semiconductor material to provide a maximum transfer of energy to the semiconductor material. In other words, a high transfer efficiency may be provided, which reduces the energy needed for LTA. Alternatively, the wavelength of the laser light is adapted according to the desired absorption length. A short wavelength may result in a concentration of energy in the surface portion.

One the one hand, due to the high absorption, also the penetration depth of the laser light may be limited depending on the wavelength of the laser light. The total energy of the laser light may be limited according to the thermal limits the semiconductor material can withstand. Therefore, the process itself may limit a depth of the semiconductor material in which the dopant is activated.

On the other hand, even if the wavelength of the laser light is adjusted according to a maximum transfer of energy, still a large portion of the laser light is inherently reflected by the semiconductor material and cannot be used for transferring energy to the semiconductor material anymore. For example, the semiconductor material reflects conventionally about 60% of the laser light. Therefore, the total energy needed to obtain a desired amount of thermal energy transferred to the semiconductor material is much higher than the thermal energy. In other words, the power consumption of the laser light source and the corresponding investment costs to provide process equipment having the required power capability (e.g. sufficient optics, multiple pulse lasers, and multiple wavelength lasers) are conventionally high.

Conventionally, an antireflective coating is formed over the semiconductor material to reduce the amount of reflected light. However, the antireflective coating may affect the result of the thermal treatment due to mechanical stress incorporated in the antireflective coating. Conventional antireflective coatings are based on an interplay of constructive interference and destructive interference provided by a complex layer architecture, and therefore may need high effort to be prepared. Further, inherent stress may be built into the antireflective coating due to the preparation, which may relax when the underlying portion of the semiconductor material is melted. The topographical image of the relaxed antireflective coating may be in incorporated into the solidifying portion of the semiconductor material. A compressively stressed coating tends to crack and to spall if the support by the mechanically rigid underlying semiconductor material is lost due to its melting. Further, the coating may intermix with the melted semiconductor material and contaminate the semiconductor material. This may lead to processing faults or limit the processing range, e.g. the thermal treatment.

SUMMARY

According to various embodiments, a method may include: disposing a dopant in a semiconductor region; forming a radiation absorption layer including or formed from at least one allotrope of carbon over at least a portion of the semiconductor region; and activating the dopant at least partially by irradiating the radiation absorption layer at least partially with electromagnetic radiation to heat the semiconductor region at least partially.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
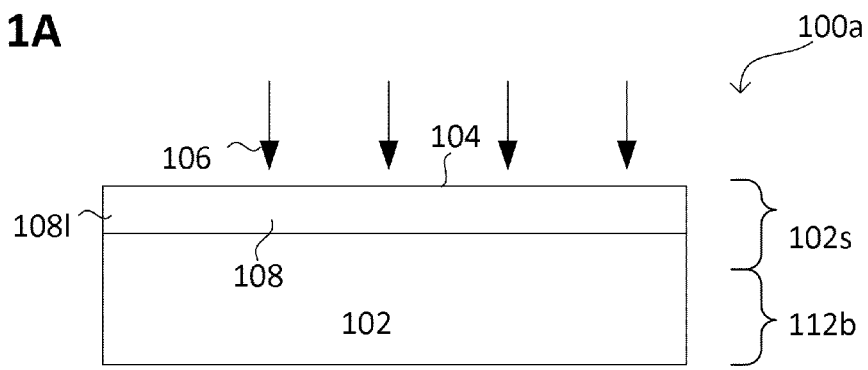
FIG. 1A, FIG. 1B and FIG. 1C respectively show a semiconductor device according to various embodiments in a method according to various embodiments in a schematic cross sectional view or side view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The phrase "at least one of" in regard to a group of elements may be used herein to mean at least one element from the group consisting of the elements. For example, the phrase "at least one of" in regard to a group of elements may be used herein to mean a selection of: one of the listed elements, a plurality of one of the listed elements, a plurality of individual listed elements, or a plurality of a multiple of listed elements.

According to various embodiments, a metallic material may include or be formed from at least one chemical element of the following group of chemical elements (also referred to as metals): tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), zirconium (Zr) or may include or be formed from a metal alloy including at least one chemical element of the group of chemical elements. By way of example, a metal alloy may include or be formed from at least two metals (e.g. two or more than two metals, e.g. in the case of an intermetallic compound) or at least one metal (e.g. one or more than one metal) and at least one other chemical element (e.g. a non-metal or a half metal). By way of example, a metal alloy may include or may be formed from at least one metal and at least one non-metal (e.g. carbon (C) or nitrogen (N)), e.g. in the case of steel or a nitride. By way of example, a metal alloy may include or may be formed from more than one metal (e.g. two or more metals), e.g. various compositions of gold with aluminum, various compositions of copper with aluminum, various compositions of copper and zinc (e.g. "brass") or an various compositions of copper and tin (e.g. "bronze"), e.g. including various intermetallic compounds. According to various embodiments, a metallic material may be electrically conductive.

A semiconductor material, layer, region or the like may be understood as having moderate electrical conductivity, e.g. an electrical conductivity (measured at room temperature and constant electric field direction, e.g. constant electric field) in the range from about 10' Siemens per meter (S/m) to about $10^6$ S/m. An electrically conductive material (e.g. a metallic material), layer, region or the like may be understood as having high electrical conductivity, e.g. an electrical conductivity (measured at room temperature and constant electric field direction, e.g. constant electric field) greater than about $10^6$ S/m, e.g. greater than about $10^7$ S/m. An electrically insulating material, layer, region or the like may be understood as having a high electrical conductivity, e.g. an electrical conductivity (measured at room temperature and constant electric field direction, e.g. constant electric field) less than about $10^{-6}$ S/m, e.g. less than about $10^{-10}$ S/m.

According to various embodiments, a semiconductor region (e.g. including or formed from a substrate) may include or be formed from semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the semiconductor region is made of silicon (doped or undoped), in an alternative embodiment, the semiconductor region is a silicon on insulator (SOI) wafer. As an alternative, any other suitable semiconductor material can be used for the semiconductor region, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, the semiconductor region may be processed to form one or more semiconductor chips at least one of in or over the semiconductor region. A semiconductor chip may include an active chip area. The active chip area may be disposed in a portion of the semiconductor region and may include one or more semiconductor circuit elements like a transistor, a resistor, a capacitor, a diode or the like. The one or more semiconductor circuit elements may be configured to perform computing or storage operations. Alternatively or additionally, the one or more semiconductor circuit elements may be configured to perform switching or rectifying operations, e.g. in power electronics.

According to various embodiments, a semiconductor chip may be singulated from the semiconductor region by removing material from a kerf region of the semiconductor region (also called dicing or cutting the semiconductor region). For example, removing material from the kerf region of the semiconductor region may be processed by scribing and breaking, cleavage, blade dicing or mechanical sawing (e.g. using a dicing saw). After singulating the semiconductor chip, it may be electrically contacted and encapsulated, e.g. by mold materials, into a chip carrier (also called a chip housing) which may then be suitable for use in electronic devices. For example, the semiconductor chip may be bonded to a chip carrier by wires, and the chip carrier may be soldered onto a printed circuit board.

According to various embodiments, a dopant activation in a (e.g. crystalline) substrate material (e.g. silicon) may be provided, e.g. by enhanced light absorption due to a coverage of the substrate material with carbon allotropes, e.g. carbon nanotubes (CNTs). The CNTs may provide intrinsically low radiation reflection. Illustratively, a substrate surface covered with carbon allotropes (e.g. CNTs) may appear optically black due to minimized radiation reflection allowing enhanced radiation absorption in the substrate.

According to various embodiments, a suitable catalyst (e.g. a metal, a metal containing material or a metal alloy, e.g. a metal compound) may be provided for forming the carbon allotropes. The catalyst (also referred to as catalyst layer) may be deposited (e.g. using a PVD process) as islands on the substrate. The islands may have very low lateral extensions (e.g. less than a few nanometers, e.g. less than 10 nm). The islands may act as growth site for the carbon allotropes, for the CNTs. Depending on process conditions (incl. precursor), the carbon allotropes may grow on or below the catalyst islands previously deposited onto the substrate (e.g. including silicon).

According to various embodiments, a radiation absorption layer for the semiconductor region may be provided. The radiation absorption layer may increase the absorption of light (e.g. in form of a laser light or flash light) by reducing the portion of light reflected. An energy (energy of the laser light) utilization (illustratively, the transferred fraction of energy) for the radiation absorption layer may be greater than for the semiconductor region, e.g. for a planar surface of the semiconductor region. The energy transferred to the semiconductor region may be optionally used for melting a portion of the semiconductor region.

According to various embodiments, a surface of the semiconductor region may be covered by the radiation absorption layer, e.g. selectively, for increasing the absorption of laser light. The radiation absorption layer may increase (or maximize) the absorption of laser light and heat conduction to the semiconductor region. Forming the radiation absorption layer may be provided by various processes as described herein.

According to various embodiments, the radiation absorption layer (e.g. the at least one carbon allotrope) may have a high electrical conductivity (e.g. a metallic behavior) or moderate electrical conductivity (e.g. a semiconducting behavior). Optionally, the radiation absorption layer (e.g. the at least one carbon allotrope) may have an thermal conductivity of more than about 500 Watt per meter and Kelvin (W/m·K), e.g. more than about 1000 W/m·K, e.g. more than about 2000 W/m·K, e.g. more than about 3000 W/m·K, e.g. more than about 4000 W/m·K, e.g. more than about 5000 W/m·K, e.g. more than about 5500 W/m·K, e.g. more than or equal to about 6000 W/m·K. At least one of the electrical conductivity and the thermal conductivity may be understood as parallel to a direction pointing to the semiconductor region (e.g. parallel to a macroscopic surface normal of the semiconductor region). According to various embodiments, the radiation absorption layer may include a plurality of particles, each including or formed from at least one carbon allotrope. The plurality of particles may be disposed separate from each other.

According to various embodiments, increasing the absorption of light (e.g. laser light) may result in an increased energy transfer to the semiconductor region via the radiation absorption layer. Increasing the absorption of light (or the energy transfer to the semiconductor region respectively) may result in a thermal activation of the dopant. During the activation of the dopant, the semiconductor region may be partially shadowed by the radiation absorption layer, illustratively, resulting in a fingerprint of the radiation absorption layer remaining in the semiconductor region. The fingerprint may provide indirect evidence of an increased absorption of light (or the energy transfer respectively). The fingerprint may occur for example, if the radiation absorption layer includes a plurality of carbon nanotubes, which locally conduct heat to the semiconductor region. This spatially inhomogeneity of the radiation absorption layer may alter the electronic properties of the semiconductor region.

The usage of a radiation absorption layer according to various embodiments may be confirmed by structural and/or chemical analysis of various types to reveal the presence of the fingerprint. The fingerprint may be characterized by a plurality of portions of the semiconductor region embedded separated from each other (e.g. disjoint) in a further portion of the semiconductor region and differing in their electronic properties from the further portion.

Figure 1B:
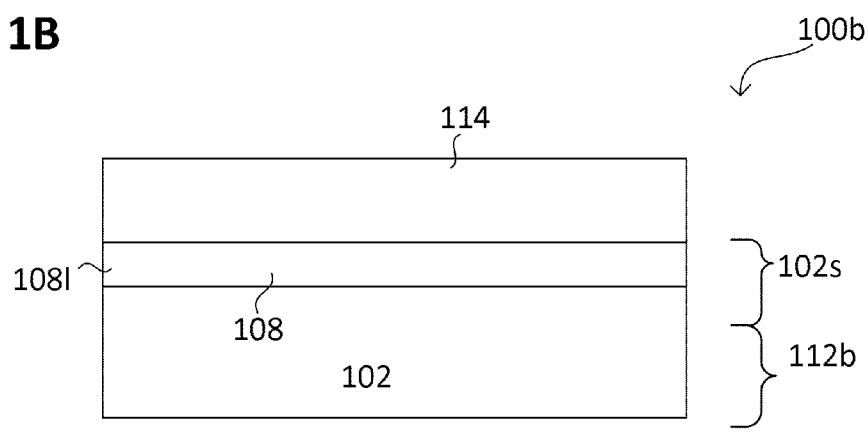
Figure 1C:
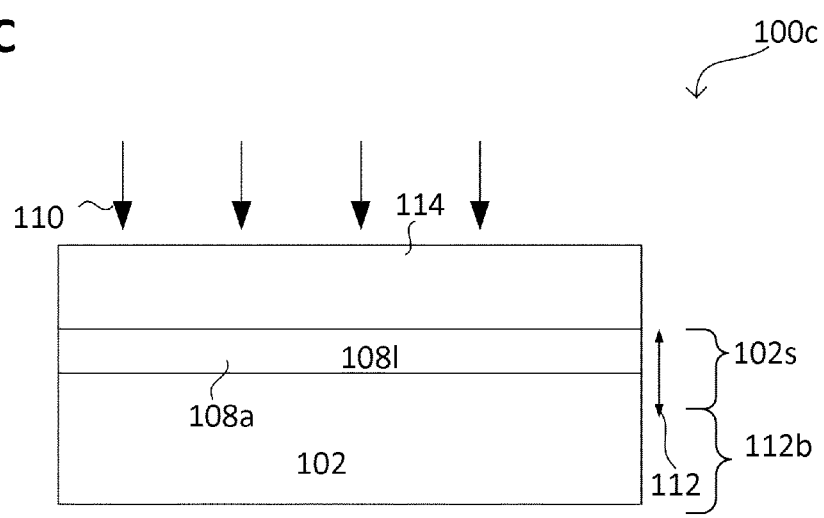

FIG. 1A, FIG. 1B and FIG. 1C illustrate a semiconductor device according to various embodiments in a method according to various embodiments in a schematic cross sectional view or side view According to various embodiments, the method may include in 100a disposing 106 a dopant 108 in the semiconductor region 102, e.g. through a surface 104 of the semiconductor region 102. The semiconductor region 102 may include or be formed from a wafer (also referred to as substrate), e.g. a semiconductor wafer, e.g. a silicon wafer. In an embodiment, the semiconductor region 102 may be a portion of a wafer. In an embodiment, the semiconductor region 102 may be a wafer.

Disposing the dopant in the semiconductor region 102 may include to form a concentration of the dopant (in other words, atoms of the dopant) in the semiconductor region 102 greater than about $10^{15}$ atoms per cubic centimeter (atoms/cm$^3$), e.g. greater than about $10^{16}$ atoms/cm$^3$, e.g. greater than about $10^{17}$ atoms/cm$^3$, e.g. greater than about $10^{18}$ atoms/cm$^3$, e.g. greater than about $10^{19}$ atoms/cm$^3$, e.g. greater than about $10^{20}$ atoms/cm$^3$, e.g. greater than about $10^{21}$ atoms/cm$^3$ or even higher (e.g. substantially equal to a solubility of the dopant in the semiconductor region 102), e.g. in the range from about $10^{16}$ atoms/cm$^3$ to about $10^{22}$ atoms/cm$^3$, e.g. in the range from about $10^{16}$ atoms/cm$^3$ to about $10^{18}$ atoms/cm$^3$.

Disposing the dopant in the semiconductor region 102 may include in 100a transferring the dopant 108 into the semiconductor region 102, e.g. by ion beam implantation. In other words, the dopant may be implanted into the semiconductor region 102 by ion beam implantation. For implanting the dopant 108, the semiconductor region 102 may be irradiated with an ion beam 106 including ions of the dopant 108. Alternatively or additionally, the dopant 108 may be provided by a gas 106 (also referred to as dopant source gas) including the dopant 108, wherein the dopant 108 is released from the gas and diffuses into the semiconductor region 102. Alternatively or additionally, the dopant may be provided via a dopant source layer (see FIG. 3A).

By disposing 106 the dopant 108 in the semiconductor region 102, a layer 108l (also referred to as doped layer 108l) including the dopant and material of the semiconductor region 102 may be formed. The doped layer 108l may be formed in a surface portion 102s of the semiconductor region 102, wherein the surface portion 102s of the semiconductor region 102 adjoins a surface 104 of the semiconductor region 102. In other words, the doped layer 108l may be formed between the surface 104 of the semiconductor region 102 and a base region 112b of the semiconductor region 102. By way of example, the doped layer 108l may include or be formed from a backside collector layer.

According to various embodiments, the method may include in 100b forming a radiation absorption layer 114 over the semiconductor region 102 (e.g. over the doped layer 108l), e.g. for reducing a reflectance. The surface 104 of the semiconductor region 102 may be covered at least partially by the radiation absorption layer 114. In an embodiment, the surface 104 may be covered partially by the radiation absorption layer 114. In an embodiment, the surface 104 may be covered fully by the radiation absorption layer 114.

Reducing the reflectance may provide an increased absorption of electromagnetic radiation via the radiation absorption layer 114. In other words, an absorption coefficient of the radiation absorption layer 114 may be more than an absorption coefficient of the semiconductor region 102. Respectively a reflection coefficient of the radiation absorption layer 114 may be less than a reflection coefficient of the semiconductor region 102. The absorption coefficient may describe a fraction of incident electromagnetic radiation, which is absorbed, e.g. by the semiconductor region 102 or the radiation absorption layer 114. The absorbed electromagnetic radiation may be transformed into thermal energy. The reflection coefficient may describe a fraction of incident electromagnetic radiation, which is reflected (including reemission) by the semiconductor region 102 and the radiation absorption layer 114 respectively. The reflection coefficient may be understood as also referring to non-uniform reflection (reemission), e.g. via scattering the electromagnetic radiation.

According to various embodiments, the method may include in 100c activating the dopant 108 at least partially by irradiating the radiation absorption layer 114 at least partially with electromagnetic radiation 110. The electromagnetic radiation may be at least partially absorbed by the radiation absorption layer 114 (in other words, transferred into thermal energy). The thermal energy may than be transferred (conducted) to the semiconductor region 102, e.g. via thermal conduction.

By irradiating the radiation absorption layer 114, the semiconductor region 102 may be at least partially heated (in other words, at least a portion of the semiconductor region 102 may be heated). By activating the dopant 108, an activated dopant 108a may be provided. By activating the dopant 108, the dopant 108 may be incorporated into the semiconductor region 102, e.g. in a lattice structure of the semiconductor region 102, to provide the activated dopant 108a. Alternatively or additionally, by activating the dopant 108 the dopant 108 may chemically react with the semiconductor region 102, e.g. with the material of the semiconductor region 102, to provide the activated dopant 108a. By activating the dopant 108 at least one of an electrical property of the surface portion 102s, e.g. of the doped layer 108l, may be changed. For example, an electrical conductivity of the surface portion 102s, e.g. of the doped layer 108l, may be increased by activating the dopant 108.

During heating the semiconductor region 102, a temperature of the semiconductor region 102, e.g. of the surface portion 102s of the semiconductor region 102, may be increased, e.g. by a temperature difference. The temperature difference may be at least about 200 Kelvin (K), e.g. at least about 400 K, e.g. at least about 600 K, e.g. at least about 800 K, e.g. at least about 1000 K, e.g. in the range from about 600 K to about 1500 K. The temperature difference may be provided within a heating time defining a rate of the temperature difference over the heating time (also referred to as heating rate). The heating rate may be greater than about 100 Kelvin per second (K/s), e.g. greater than about 200 K/s, e.g. greater than about 300 K/s, e.g. greater than about 400 K/s, e.g. greater than about 1000 K/s (corresponding to $10^3$ K/s), e.g. greater than about 2000 K/s, e.g. greater than about 5000 K/s, e.g. greater than about $10^4$ K/s, e.g. greater than about $10^5$ K/s, e.g. greater than about $10^6$ K/s, e.g. greater than about $10^7$ K/s, e.g. greater than about $10^8$ K/s, e.g. greater than about $10^9$ K/s, e.g. greater than about $10^{10}$ K/s. The heating time may be defined by (e.g. equal to) the irradiation time, in other words, the time in which the radiation absorption layer 114 is irradiated by the electromagnetic radiation 110 (e.g. forming a temperature gradient pointing to the radiation absorption layer 114). The irradiation time (e.g. per radiation pulse) may be less than about one microsecond (1

μs), e.g. less than about 1 nanosecond (1 ns), e.g. less than about 100 picoseconds (100 ps), e.g. less than about 10 picoseconds (10 ps).

The temperature difference and the heating depth (in other words, the depth in the semiconductor region up to which the semiconductor region is heated, e.g. by at least the temperature difference) may define a temperature gradient formed by irradiating the radiation absorption layer 114. The temperature gradient may point to the radiation absorption layer 114. The temperature gradient may be defined by the ratio of the temperature difference and the heating depth, e.g. least about 200 Kelvin (K) per heating depth (d), e.g. at least about 400 K/d, e.g. at least about 600 K/d, e.g. at least about 800 K/d, e.g. at least about 1000 K/d, e.g. in the range from about 600 K/d to about 1500 K/d. For example, the temperature gradient may be at least about 200 Kelvin per micrometer (K/μm), e.g. at least about 400 K/μm, e.g. at least about 600 K/μm, e.g. at least about 800 K/μm, e.g. at least about 1000 K/μm, e.g. in the range from about 600 K/μm to about 1500 K/μm.

For activating the dopant 108, the semiconductor region 102 may be at least partially, e.g. at least the surface portion 102s of the semiconductor region 102, heated to a temperature (e.g. greater than or equal to a dopant-activation temperature) of at least 70% of a melting temperature of the semiconductor region, e.g. greater than 900° C. (e.g. to provide a mixed phase or a glass phase).

According to various embodiments, a thickness 112 (also referred to as heating depth 112, e.g. melting depth if melted) of a portion of the semiconductor region 102 (e.g. the surface portion 102s) which is heated, e.g. by at least the temperature difference, may be greater than about 0.4 μm, e.g. greater than about 0.5 μm, e.g. greater than about 0.6 μm, e.g. greater than about 0.7 μm, e.g. greater than about 0.8 μm, e.g. greater than about 0.9 μm, e.g. greater than about 1 μm, e.g. greater than about 1.5 μm, e.g. greater than about 2 μm, e.g. in the range from about 1 μm to about 100 μm. The heating depth 112 may be a spatial averaged depth. The heating depth 112 may be greater than a thickness of the doped layer 1081, e.g. greater than an implantation depth (the penetration depth of the ion beam into the semiconductor region 102), which may be defined by an energy of the ions of the ion beam. The heating depth 112 may define a temperature gradient (e.g. along the depth direction, e.g. parallel to a macroscopic surface normal of the semiconductor region 102), e.g. by a temperature difference within the heating depth 112.

The semiconductor region 102 may be at least partially heated, that means at least the surface portion 102s of the semiconductor region 102 may be heated. The surface portion 102s may optionally be segmented. For example, the surface portion 102s may include a plurality of segments, which are heated to a temperature greater than a temperature between the segments. Therefore, a mask 1802 may be used exposing the plurality of segments of the surface portion 102s (see for example, FIG. 10A).

According to various embodiments, the heating process may include or be formed from at least one of a non-equilibrium heating process and a non-thermal heating process. The non-thermal heating process may include forming the electromagnetic radiation by an electromagnetic radiation source, wherein a wavelength of the electromagnetic radiation may be independent from a temperature of the electromagnetic radiation source. For example, the wavelength of the electromagnetic radiation may be defined by at least one of a material of the electromagnetic radiation source (e.g. an optically active material), an optical resonator of the electromagnetic radiation source and an energy supplied to the electromagnetic radiation source. For example, the electromagnetic radiation source may include or be formed from a non-thermal electromagnetic radiation source.

According to various embodiments, the electromagnetic radiation source may include or be formed from an optical resonator, e.g. in case of a laser source. In this case, the electromagnetic radiation may include or may be laser radiation, polarized radiation, pulsed radiation, and/or coherent radiation. Pulsed radiation may include at least one electromagnetic radiation pulse (one or more electromagnetic radiation pulses).

A non-equilibrium heating process may include forming a temperature gradient in the semiconductor region 102. For example, an equilibrium heating process may require a furnace. Illustratively, in a non-equilibrium heating process substantially no thermal equilibrium is reached during the heating. For example, in a non-equilibrium heating process the radiation absorption layer 114 may absorb a larger amount of electromagnetic radiation than it emits, for example, the radiation absorption layer 114 may absorb at least two times the electromagnetic radiation it emits, for example, at least five times the electromagnetic radiation it emits, for example, at least ten times the electromagnetic radiation it emits, for example, at least hundred times the electromagnetic radiation it emits (e.g. during irradiation). Alternatively or additionally, in a non-equilibrium heating process a thermal energy introduced by the electromagnetic radiation may propagate further (e.g. to the semiconductor region 102, e.g. to a portion of the semiconductor region 102 that lies deeper than the heating depth) after the electromagnetic radiation is switched of or interrupted (e.g. between pulses of the electromagnetic radiation). For example, the non-equilibrium heating process may include or may be achieved by heating the semiconductor region 102 substantially only via the radiation absorption layer 114. As used herein, heating the semiconductor region 102 may be understood as transferring thermal energy (e.g. via electromagnetic radiation) into the semiconductor region 102 and/or through the surface 104 of the semiconductor region 102 (into a portion of the semiconductor region 102 adjacent to the surface 104, also referred to as surface portion 102s). For example, heating the semiconductor region 102 may include irradiating the radiation absorption layer 114 by electromagnetic radiation, wherein the electromagnetic radiation may be absorbed at least partially by the radiation absorption layer 114 and at least partially by the surface portion 102s of the semiconductor region 102 adjacent (e.g. adjoining) to the radiation absorption layer 114. In this connection, the "region adjacent to the surface" or "surface portion 102s" may refer to a region that reaches to a depth 112 of up to about 100 μm, up to about 50 μm, up to about 20 μm, e.g. up to about 15 μm, e.g. up to about 10 μm, e.g. up to about 5 μm, e.g. up to about 3 μm, e.g. up to about 2 μm.

According to various embodiments, the electromagnetic radiation may include at least one discrete wavelength (one or more discrete wavelengths, e.g. two, three, four, five, more than five, e.g. ten or more than ten discrete wavelengths). Radiation having a discrete wavelength may be understood as radiation having a distinct (e.g. line-shaped) radiation intensity peak at the discrete wavelength. The radiation intensity peak may be broadened defining a range of wavelengths around the discrete wavelength (illustratively, a broadness). The radiation intensity peak may have a width (e.g. a full width half maximum (FWHM)) less than about 25% of the (value of the) discrete wavelength, e.g. less than about 10% of the discrete wavelength, e.g. less than about 5% of the discrete wavelength, e.g. less than about 2.5% of the discrete wavelength, e.g. less than about 1% of the discrete wavelength. For example, a radiation intensity peak having a FWHM of less than about 25% (e.g. 10%, 5%, or 1%) of the peak position and/or less than about 10 nm (e.g. 5 nm, 1 nm, 0.5 nm or 0.1 nm) may be understood as a discrete wavelength. If the electromagnetic radiation includes more than one discrete wavelength (e.g. more than one radiation intensity peak), optionally at least two adjacent discrete wavelengths may partially overlap. For example, two adjacent radiation intensity peaks of the electromagnetic radiation may be understood as discrete wavelengths, if a radiation intensity between the two radiation intensity peaks drops to less than about 50% (e.g. 25%, 10%, 5%, or 1%) of the maximum radiation intensity of that radiation intensity peak of the two adjacent radiation intensity peaks that has the lower maximum radiation intensity. Alternatively or additionally, two adjacent radiation intensity peaks of the electromagnetic radiation may be understood as discrete wavelengths, if a distance between the two adjacent radiation intensity peaks (e.g. between their peak positions) is larger than a width (e.g. a FWHM) of that radiation intensity peak of the two adjacent radiation intensity peaks that has the larger width, e.g. more than 200% of the width, e.g. more than 500% of the width.

According to various embodiments, the electromagnetic radiation used for irradiating the radiation absorption layer 114 may include or may be electromagnetic radiation (e.g. having at least one discrete wavelength) within an electromagnetic radiation range (also referred to as absorbing range) for which the reflectance of the semiconductor region 102 is less than that of the radiation absorption layer 114, e.g. by a value of at least about 0.1, e.g. at least about 0.2, e.g. at least about 0.3, e.g. at least about 0.4, e.g. at least about 0.5, e.g. at least about 0.6. In other words, the radiation absorption layer 114 may define the absorbing range (e.g. defining at least one of the electromagnetic radiation, a wavelength range, an energy range and a frequency range) for which the radiation absorption layer 114 has the reflectance more than that of the semiconductor region 102, by at least the value.

According to various embodiments, an thermal energy may be absorbed mainly by the surface portion 102s (in other words, within a heating depth), e.g. more than about 50% (e.g. more than about 75%, e.g. more than about 80%, e.g. more than about 90%) of the thermal energy transformed from the electromagnetic radiation may be absorbed by the surface portion 102s.

According to various embodiments, the semiconductor region 102 may include or be formed from a single crystalline semiconductor material (also referred to as single crystalline material of the semiconductor region 102). Alternatively or additionally, the semiconductor region 102 may include or be formed from a polycrystalline semiconductor material (also referred to as polycrystalline material of the semiconductor region 102).

Figure 2A:
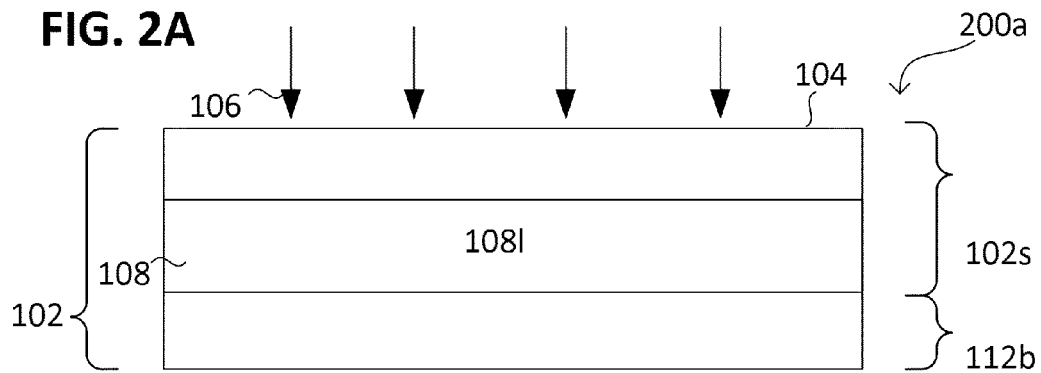
FIG. 2A, FIG. 2B and FIG. 2C respectively show a semiconductor device according to various embodiments in a method according to various embodiments in a schematic cross sectional view or side view.
Figure 2B:
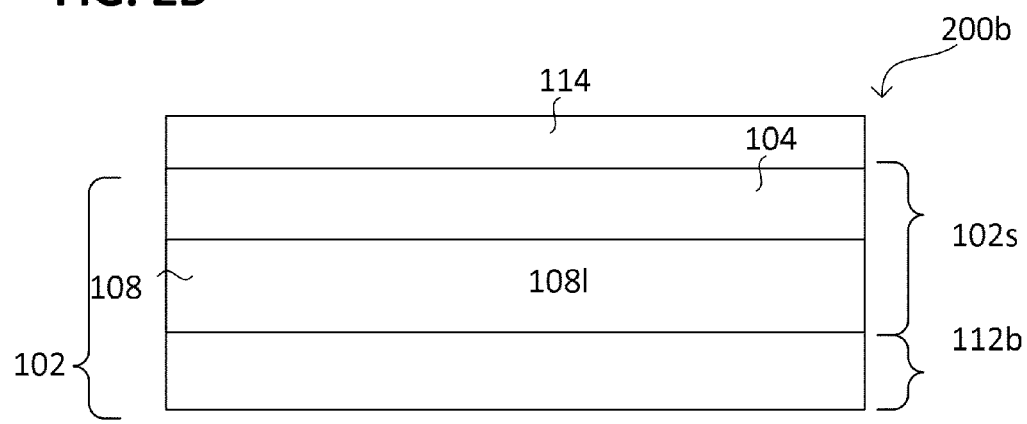
Figure 2C:
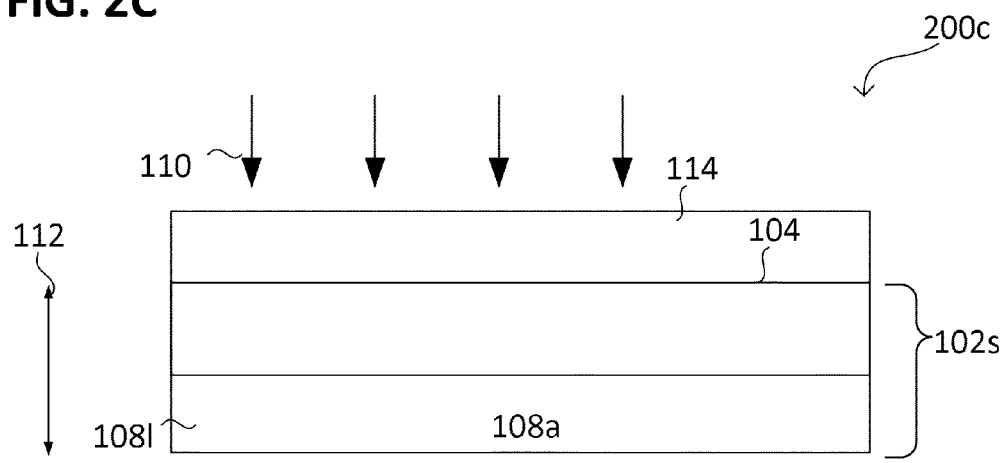

FIG. 2A, FIG. 2B and FIG. 2C respectively illustrate a semiconductor device according to various embodiments in a method according to various embodiments in a schematic cross sectional view or side view.

According to various embodiments, the method may include in 200a disposing 106 the dopant 108 in the semiconductor region 102, e.g. distant from the surface 104 of the semiconductor region 102. Disposing 106 the dopant 108 in 200a may be configured similar to disposing 106 the dopant 108 in 100a. Illustratively, the dopant 108 may be disposed distant from the surface 104 of the semiconductor region 102 by using a large implantation depth. Alternatively or additionally, the doped layer 1081 may be covered by (e.g. undoped) material of the semiconductor region 102 (e.g. at least partially) after disposing 106 the dopant 108. For example, the doped layer 1081 may be at least partially buried in the semiconductor region 102.

By disposing 106 the dopant 108 in the semiconductor region 102, the doped layer 1081 may be formed including the dopant and material of the semiconductor region 102. The doped layer 1081 may be formed in a surface portion 102s of the semiconductor region 102, wherein the surface portion 102s of the semiconductor region 102 includes the surface 104 of the semiconductor region 102 (e.g. a planar surface 104). In other words, the doped layer 1081 may be formed between the surface 104 of the semiconductor region 102 and the base region 112b of the semiconductor region 102, e.g. distant from the surface 104 of the semiconductor region 102.

According to various embodiments, the method may include in 200b forming the radiation absorption layer 114 over the semiconductor region 102, e.g. distant from the base region 112b of the semiconductor region 102. Forming the radiation absorption layer 114 in 200b may be configured similar to forming the radiation absorption layer 114 in 100b (see FIG. 1B).

According to various embodiments, the method may include in 200c activating the dopant 108 at least partially by irradiating the radiation absorption layer 114 at least partially with electromagnetic radiation 110 to heat the semiconductor region 102 at least partially. In other words, the activated dopant 108a may be provided. Activating the dopant 108 in 200c may be configured similar to activating the dopant 108 in 100c.

Figure 3A:
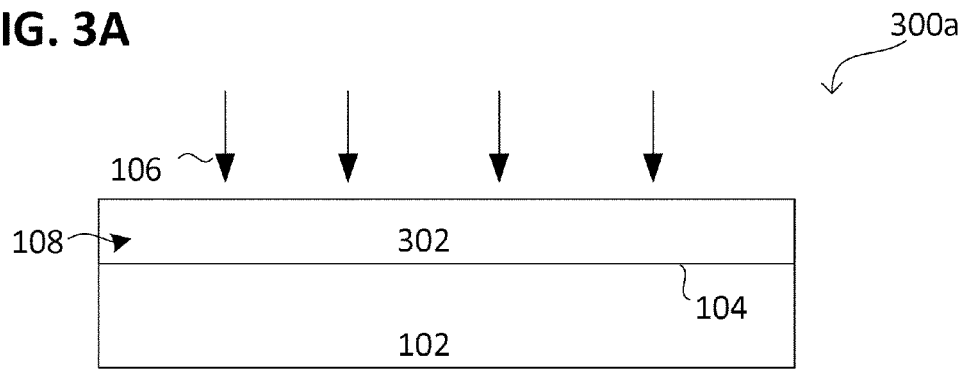
FIG. 3A, FIG. 3B and FIG. 3C respectively show a semiconductor device according to various embodiments in a method according to various embodiments in a schematic cross sectional view or side view.
Figure 3B:
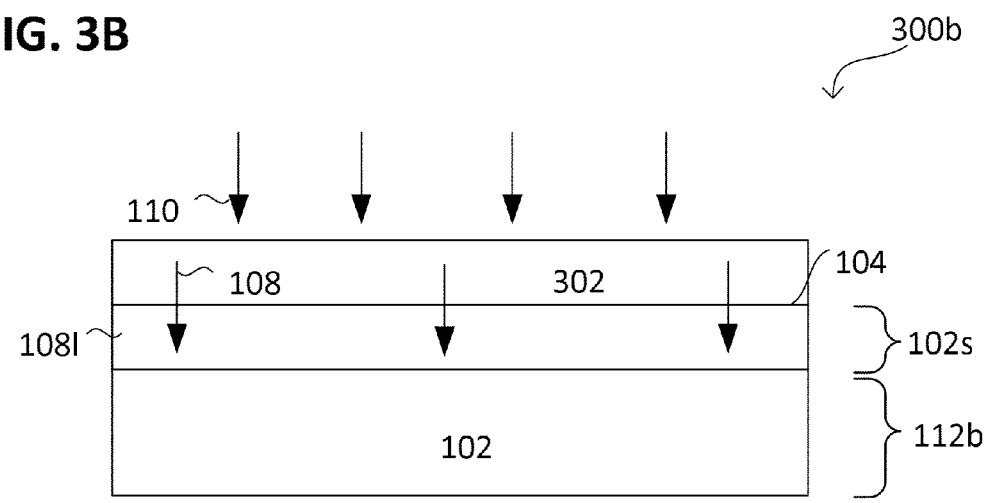

FIG. 3A and FIG. 3B respectively illustrate a semiconductor device according to various embodiments in a method according to various embodiments in a schematic cross sectional view or side view.

According to various embodiments, the disposing the dopant in the semiconductor region 102 may include in 300a forming a dopant source layer 302 over the semiconductor region 102, e.g. over the surface 104 of the semiconductor region 102. The dopant source layer 302 may be formed using at least one of: physical vapor deposition, chemical vapor deposition, or fluid deposition (e.g. spin coating). Alternatively or additionally, the dopant source layer 302 may include or be formed from a doped oxide layer. In at least one embodiment the dopant source layer 302 may be provided by (e.g., as part of) a further wafer (more generally, a further semiconductor region). The further semiconductor region may be disposed over the semiconductor region 102. By heating the further semiconductor region, the dopant may be diffused out of the further semiconductor region and into the semiconductor region 102 (which may be also referred to as face-to-face transfer).

The dopant source layer 302 may include the dopant 108, e.g. at least one of disposed in or as part of a host material of the dopant source layer 102, e.g. chemically bonded in the host material. The dopant source layer 302 may be formed by depositing the host material over the semiconductor region 102, e.g. over the surface 104 of the semiconductor region 102.

According to various embodiments, disposing the dopant in the semiconductor region 102 may include in 300b transferring the dopant 108 into the semiconductor region 102, e.g. from the dopant source layer 302. The dopant source layer 302, e.g. the host material, may be configured to provide the dopant 108, e.g. by heating the dopant source layer 302. The dopant source layer 302 may be heated by at least one of: irradiation with electromagnetic radiation 110 or tempering. The dopant 108 provided by the dopant source layer 302 may migrate (e.g. by chemical reaction and/or diffusion) into the semiconductor region 102, e.g. forming the doped layer 108l (see for example, FIG. 1B and FIG. 2B).

According to various embodiments, irradiating the dopant source layer 102 with electromagnetic radiation 110 may be not sufficient to activate dopant 108 simultaneously. In other words, after transferring the dopant 108 into the semiconductor region 102, the radiation absorption layer 114 may be disposed over the semiconductor region 102 for activating the dopant 108, as illustrated in FIG. 1C and FIG. 2C. Therefore, the dopant source layer 102 may be removed from the semiconductor region 102 (to expose the semiconductor region 102) before forming the radiation absorption layer 114.

Figure 3C:
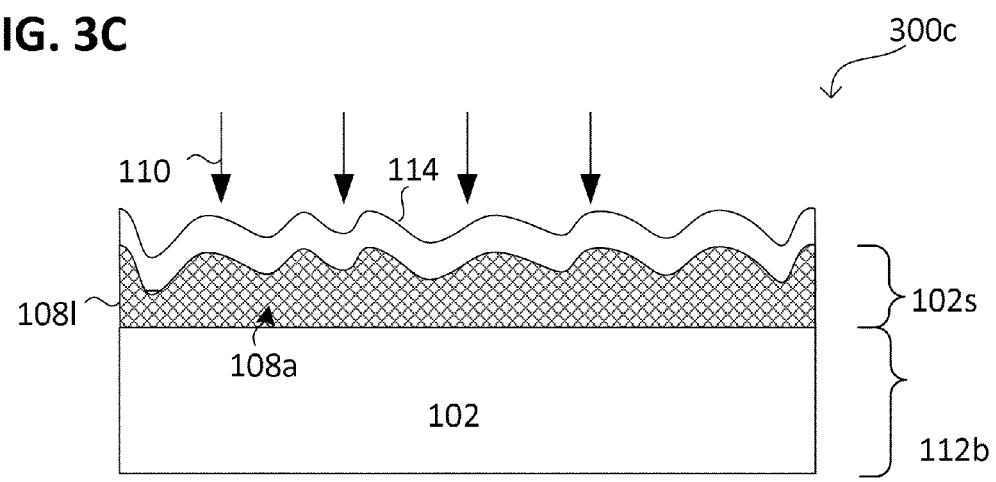

FIG. 3C illustrates a semiconductor device according to various embodiments in a method according to various embodiments in a schematic cross sectional view or side view.

According to various embodiments, the method may include in 300c heating the semiconductor region 102 via irradiating the radiation absorption layer 114 with electromagnetic radiation 110.

By heating, the semiconductor region 102, e.g. the surface portion 102s of the semiconductor region 102, may be optionally melted at least partially, in other words partially (e.g. sectionally) or completely. For example, during activating the dopant, the surface portion 102s of the semiconductor region 102 may be partially in a melted phase and partially in a solid phase (mixed phase). Alternatively or additionally, the semiconductor region 102 may be at least partially in a glass phase (illustratively, between the solid phase and the melted phase). The glass phase may have a viscosity greater than the melted phase of the semiconductor region 102.

Alternatively, the semiconductor region 102 may remain in the solid phase during heating (in other words, without leaving the solid phase). Maintaining the solid phase of the semiconductor region 102 may facilitate a homogeneous activation and/or dopant distribution in the semiconductor region 102.

A melting temperature of the semiconductor region 102 may be less than (e.g. about 75% of, e.g. about 50% of, e.g. about 25% of) at least one of a melting temperature and a sublimation temperature of the radiation absorption layer 114.

An absorption (absorption coefficient) of the semiconductor region 102 (e.g. its material) may be less in the glass or melted phase than in the solid phase. In other words, melting the semiconductor region 102 at least partially may reduce the absorption coefficient of the semiconductor region 102. By using the radiation absorption layer 114, the absorption of the electromagnetic radiation 110 may be maintained, e.g. independently from the state of the semiconductor region 102.

By heating, the semiconductor region 102 may be at least partially, e.g. at least the surface portion 102s of the semiconductor region 102, heated to a temperature of equal to or greater than the melting temperature of the semiconductor region 102, e.g. greater than 1200° C. (for example, to provide a transition to at least one of the glass phase or the melted phase). The temperature may be provided for a time greater than the heating time.

According to various embodiments, heating the semiconductor region 102 may define a temperature peak (e.g. the maximum temperature at the end of the heating time) greater than 70% of the melting temperature of the semiconductor region 102, e.g. greater than 900° C., e.g. greater than the melting temperature of the semiconductor region 102.

According to various embodiments, the absorption of electromagnetic radiation 110 (e.g. including laser light) via the radiation absorption layer 114 may result in a stable energy transfer to the semiconductor region 102 (from the electromagnetic radiation).

Figure 4A:
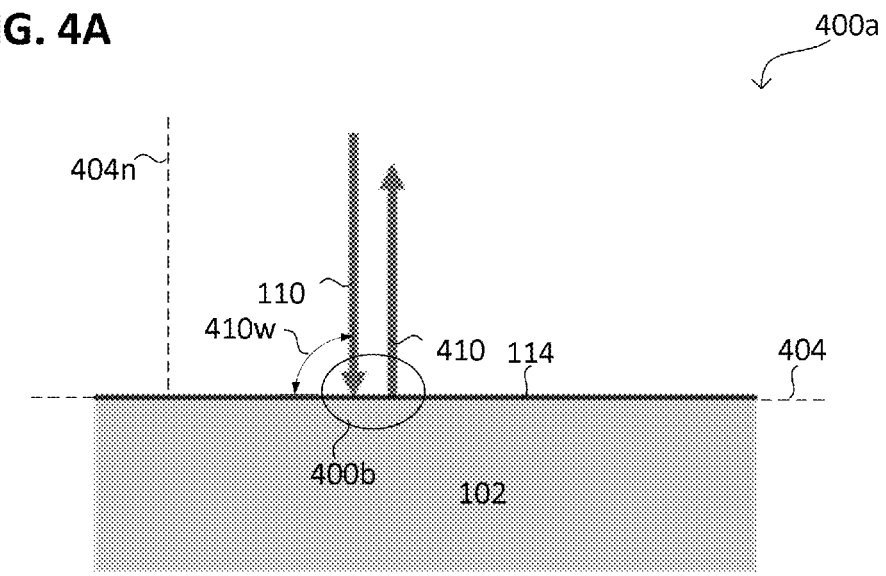
FIG. 4A and FIG. 4B respectively show a semiconductor device according to various embodiments in a method according to various embodiments in a schematic cross sectional view or side view.
Figure 4B:
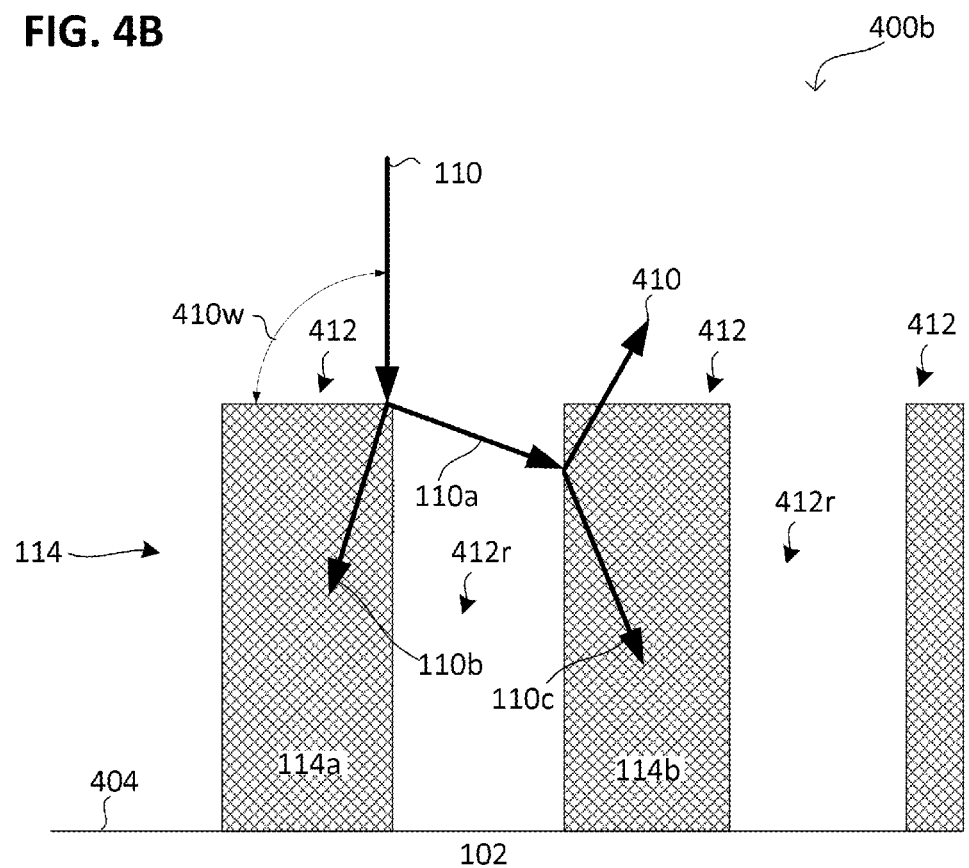

FIG. 4A and FIG. 4B respectively illustrate a semiconductor device according to various embodiments in a method according to various embodiments in a schematic cross sectional view or side view.

According to various embodiments, the method may include in 400a irradiating the radiation absorption layer 114 by electromagnetic radiation 110 incident on the semiconductor region 102 (incident electromagnetic radiation 110).

The reflection coefficient may define a fraction of the reflected electromagnetic radiation 410 to the incident electromagnetic radiation 110. The electromagnetic radiation 110 (illustratively, incoming electromagnetic radiation 110) may be provided by irradiating the radiation absorption layer 114. The electromagnetic radiation 110 may be provided by an electromagnetic radiation source, e.g. a laser source.

According to various embodiments, the reflection coefficient may be dependent on an incident angle 410w (also referred to as main incident angle 410w) between the incident electromagnetic radiation 110 and a macroscopic surface plane 404 (illustratively, mean surface plane 404) of the semiconductor region 102. The macroscopic surface plane 404 may be disposed and aligned such, that it includes a maximum number of points of (or a respective maximum intersection with) the surface of the semiconductor region 102.

According to various embodiments, the incident electromagnetic radiation 110 may be in a direction substantially perpendicular to the macroscopic surface plane 404. In other words, the incident angle 110w may be in the range from about 80° to about 100°, e.g. about 90°. In other words, the incident electromagnetic radiation 110 may substantially be parallel to a macroscopic surface normal 404n of the semiconductor region 102. The macroscopic surface normal 404n of the semiconductor region 102 may be perpendicular to the macroscopic surface plane 404 of the radiation absorption layer 114.

If the incident electromagnetic radiation 110 is in a direction substantially perpendicular to the macroscopic surface plane 404, the reflection coefficient may be minimized. The reflection coefficient may be dependent on the incident angle, the wavelength of the electromagnetic radiation and the material of the semiconductor region 102. Alternatively or additionally, the reflection coefficient may be dependent on the polarization of the electromagnetic radiation 110.

The reflection coefficient provided by the radiation absorption layer 114 according to various embodiments, may also be referred to as total effective reflection coefficient. The reflection coefficient provided by a planar surface of the semiconductor region 102 may be also referred to as reference reflection coefficient. The total effective reflection coefficient may be less than (e.g. about 75% of, e.g. about 50% of, e.g. about 25% of) the reference reflection coefficient. The total effective reflection coefficient may be less than about 0.59 (in other words, less than 59% of the incident electromagnetic radiation 110 may be reflected), e.g. less than about 0.5, e.g. less than about 0.4, e.g. less than about 0.3, e.g. less than about 0.2, e.g. less than about 0.1, e.g. less than about 0.05, e.g. in the range from about 0.01 to about 0.5.

According to various embodiments, the radiation absorption layer 114 may include or be formed from a plurality of protrusions 412, e.g. elongated protrusions 412 as illustrated in detailed view 400b (see FIG. 4B). For example, each protrusion of the plurality of protrusions 412 may be tube shaped. Between the plurality of protrusions 412 a plurality of recesses 412r may be formed, which are shaped in accordance with the plurality of protrusions 412.

As illustrated in a detailed view 400b, the radiation absorption layer 114 may provide a scattering of the incident electromagnetic radiation 110 via the plurality of protrusions 412. The radiation absorption layer 114 may be configured to provide multiple scattering of the incident electromagnetic radiation 110 as described in the following. The multiple scattering may include at least two scattering events (first scattering and second scattering).

A first portion 110a of the incident electromagnetic radiation 110 (also referred to as first scattered electromagnetic radiation 110a) may be scattered (in a first scattering event) at a first protrusion 104a of the radiation absorption layer 114 (e.g. a first CNT) towards a second protrusion 104b of the radiation absorption layer 114 (e.g. a second CNT). A second portion 110b of the incident electromagnetic radiation 110 (e.g. the leftover incident electromagnetic radiation 110) may be directed into the first protrusion 104a of the radiation absorption layer 114 and further to the semiconductor region 102 to be absorbed (for transferring its energy to the semiconductor region 102).

A first portion 410 of the first scattered electromagnetic radiation 110a (also referred to as second scattered electromagnetic radiation 410) may be scattered (second scattered) at a second protrusion 114b of the radiation absorption layer 114 away from the radiation absorption layer 114. A second portion 110c of the first scattered electromagnetic radiation 110a (e.g. the leftover first scattered electromagnetic radiation 110a) may be directed into the second protrusion 114b of the radiation absorption layer 114 and further to the semiconductor region 102 to be absorbed (for transferring its energy to the semiconductor region 102).

The second scattered electromagnetic radiation 410 may be directed away from the semiconductor region 102 as illustrated in FIG. 4B. Alternatively, the radiation absorption layer 114 may be configured such that second scattered electromagnetic radiation 410 may be directed to another protrusion of the radiation absorption layer 114. In other words, the multiple scattering may include more than two scattering events. Illustratively, the electromagnetic radiation scattered at a portion of the radiation absorption layer 114 may be directed to at least one further portion of the radiation absorption layer 114 such that at least one further portion of the electromagnetic radiation may be absorbed by the at least one further portion of the radiation absorption layer 114. For example, the electromagnetic radiation may be scattered at least one of in or outside the radiation absorption layer 114. For example, at least one portion of the electromagnetic radiation may be transmitted into a protrusion of the radiation absorption layer 114. The total effective reflection coefficient may be defined by a superposition of all of the multiple scattering events. If the multiple scattering includes two scattering events, as illustrated in FIG. 4B, the total effective reflection coefficient may be defined by a superposition of the first scattering event and the second scattering event.

According to various embodiments, the correlation between a reflection coefficient and an incident angle related thereto may depend on the shape and material of the radiation absorption layer 114 and a wavelength of the electromagnetic radiation. For example, the reflection coefficient may decrease with decreasing incident angle 410w. The variation of the reflection coefficient with the incident angle 410w of the radiation absorption layer 114 may be less than of the semiconductor region 102 (e.g. having a planar surface 104).

In contrast thereto, antireflective coatings are based on constructive interference (in direction towards the semiconductor region 102) and destructive interference (in direction away from the semiconductor region 102). Optionally, an antireflective coating (also referred to as antireflective layer) may be formed between the radiation absorption layer 114 and the semiconductor region 102 (see FIG. 11B).

Figure 5A:
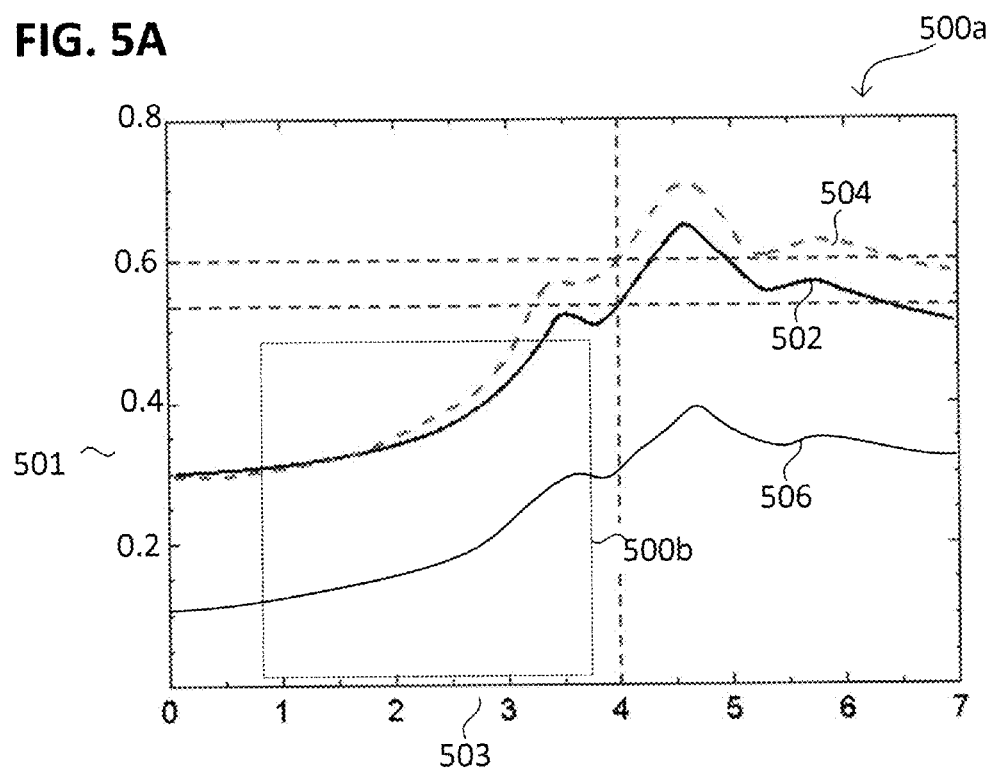
FIG. 5A and FIG. 5B respectively show a reflection characteristic of a semiconductor device according to various embodiments in a method according to various embodiments in a schematic diagram.

FIG. 5A illustrates a reflection characteristic of a semiconductor device according to various embodiments in a method according to various embodiments in a schematic diagram 500a. The schematic diagram 500a illustrates the reflection characteristic 502, 504, 506 correlating the reflectance coefficient 501 and the energy 503 (in electron Volts—eV) of the electromagnetic radiation (e.g. for a main incident angle substantially equal to 90°).

The schematic diagram 500a illustrates the reflection characteristic 502 and the reflection characteristic 504 for the reference reflectance coefficient, in other words, the correlation between the reference reflectance coefficient and the energy 503 of the electromagnetic radiation. The reflection characteristic 502 represents the reference reflectance coefficient 501 according to a theoretical expectation and the reflection characteristic 504 represents the reference reflectance coefficient 501 according to a measurement, e.g. at a planar surface of the semiconductor region 102.

The schematic diagram 500a illustrates the reflection characteristic 506 for the total effective reflectance coefficient. The reflection characteristic 506 represents the reflectance coefficient 501 for a radiation absorption layer 114 according to various embodiments, wherein a detailed view is provided in FIG. 500b.

According to various embodiments, the electromagnetic radiation may include or be formed from radiation in the range from ultraviolet radiation to infrared radiation. For example, the electromagnetic radiation may include radiation in the range from about 0.1 eV (corresponds to a wavelength of about 12400 nm, e.g. in mid infrared radiation) to about 12.4 eV (corresponds to a wavelength of about 100 nm, e.g. in vacuum ultraviolet radiation), e.g. in the range from about 1 eV (corresponds to a wavelength of about 1240 nm, e.g. in near infrared radiation) to about 7 eV (corresponds to a wavelength of about 180 nm, e.g. in vacuum ultraviolet radiation), e.g. in the range from about 2 eV (corresponds to a wavelength of about 620 nm, e.g. in red visible radiation) to about 6 eV (corresponds to a wavelength of about 205 nm, e.g. in deep ultraviolet radiation), e.g. in the range from about 3 eV (corresponds to a wavelength of about 410 nm, e.g. in violet visible radiation) to about 5 eV (corresponds to a wavelength of about 250 nm, e.g. in deep ultraviolet radiation), e.g. about 4 eV (corresponds to a wavelength of about 308 nm, e.g. in mid ultraviolet radiation). In accordance with various embodiments, the wavelength of the radiation may be in a wavelength range for which reflectance of the semiconductor region 102 is less than of the radiation absorption layer 114. This wavelength range may also be referred to herein as "absorbing range".

According to various embodiments, a reflection characteristic 506 (e.g. a total reflectance coefficient 501) of the radiation absorption layer 114 may be less than about 0.5, e.g. less than about 0.45, e.g. less than about 0.4, e.g. for electromagnetic radiation in the range (e.g. the absorbing range) from about 3 eV (corresponds to about 415 nm) to about 7 nm, e.g. in the range from about 3.5 nm (corresponds to about 350 nm) to about 5 nm (corresponds to about 250 nm). The electromagnetic radiation may be incident along a direction of a macroscopic surface normal of the semiconductor region 102. The macroscopic surface normal of the semiconductor region 102 may be perpendicular to the macroscopic surface plane 404 of the radiation absorption layer 114 (see for example, FIG. 4A and FIG. 4B).

Figure 5B:
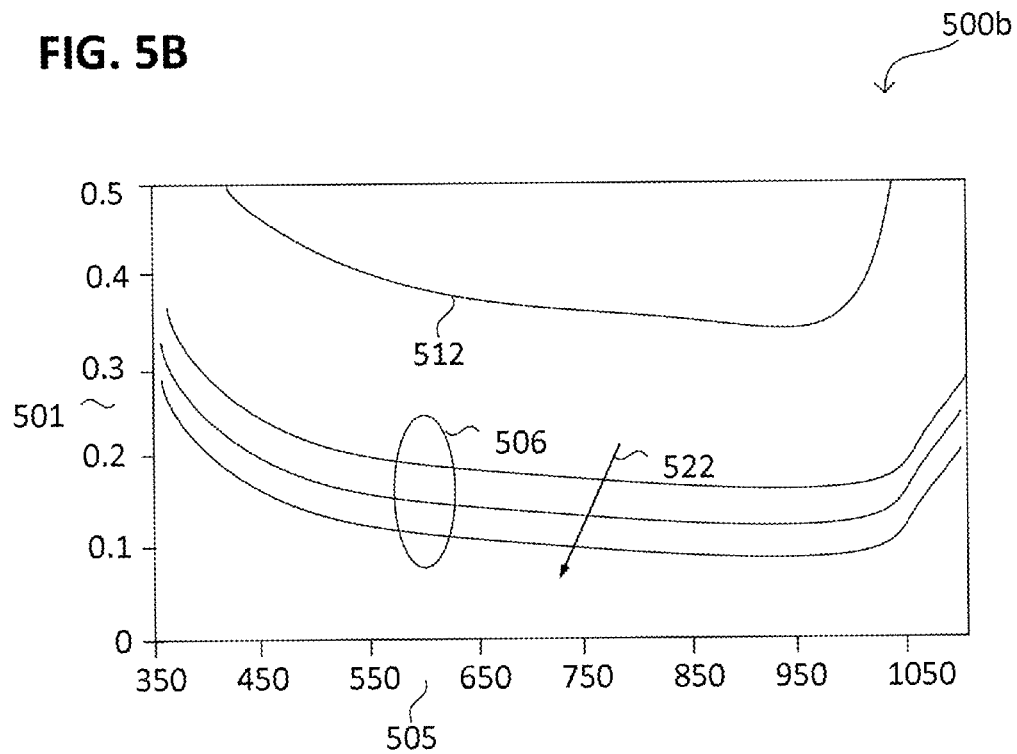

FIG. 5B illustrates a reflection characteristic of a semiconductor device according to various embodiments in a method according to various embodiments in a schematic diagram 500b. The schematic diagram 500b illustrates the reflection characteristic 512, 506 over the wavelength 505 (e.g. in nanometer—nm) of the electromagnetic radiation (e.g. for a main incident angle substantially equal to 90°).

The schematic diagram 500a illustrates the reflection characteristic 512 for the reference reflectance coefficient and the reflection characteristic 506 for the total effective reflectance coefficient (in other words, for a radiation absorption layer 114 according to various embodiments).

According to various embodiments, the electromagnetic radiation may include or be formed from radiation having a wavelength in the absorbing range, e.g. in the range from about 250 nm (corresponds to about 5 eV) to about 350 nm (corresponds to about 3.5 eV), e.g. in the range from about 300 nm (corresponds to about 4.1 eV) to about 320 nm (corresponds to about 3.88 eV), or e.g. in the range from about 500 nm (corresponds to about 2.5 eV) to about 600 nm (corresponds to about 2 eV), e.g. including or formed from green light, e.g. green laser light.

A larger wavelength may increase a penetration depth of the electromagnetic radiation, which may increase the heating depth. Alternatively or additionally, a larger wavelength may provide to increase the transferred energy, since the energy is distributed to a larger heating depth.

According to various embodiments, the total effective reflection coefficient may decrease 522 by increasing at least one of: a thickness of the radiation absorption layer 114 and a number of carbon allotropes of the radiation absorption layer 114.

Figure 6A:
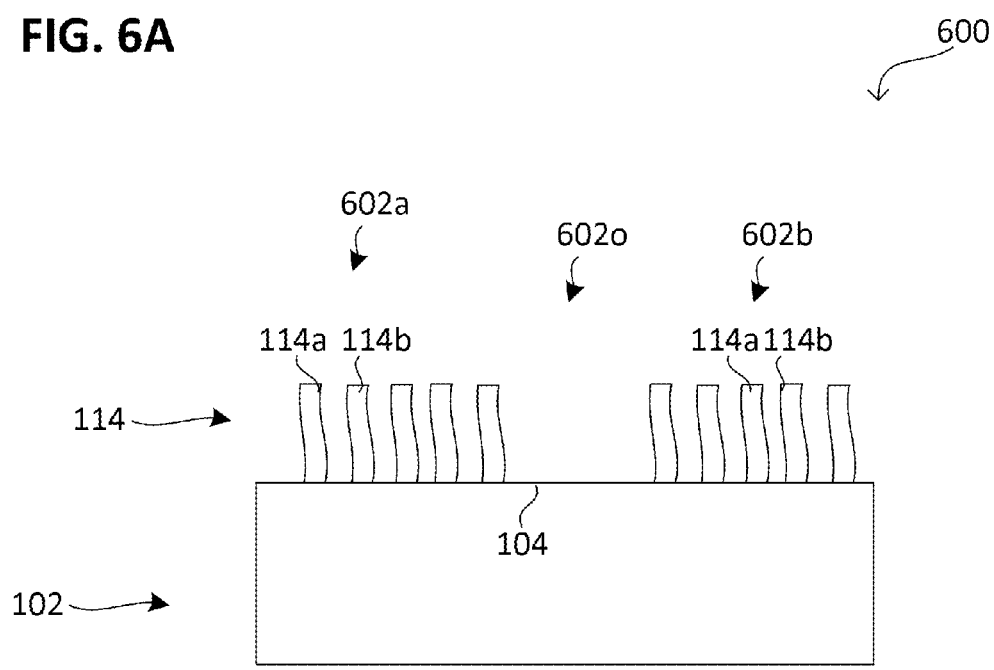
FIG. 6A and FIG. 6B respectively show a radiation absorption layer according to various embodiments in a method according to various embodiments in a schematic side view or schematical cross sectional view.
Figure 6B:
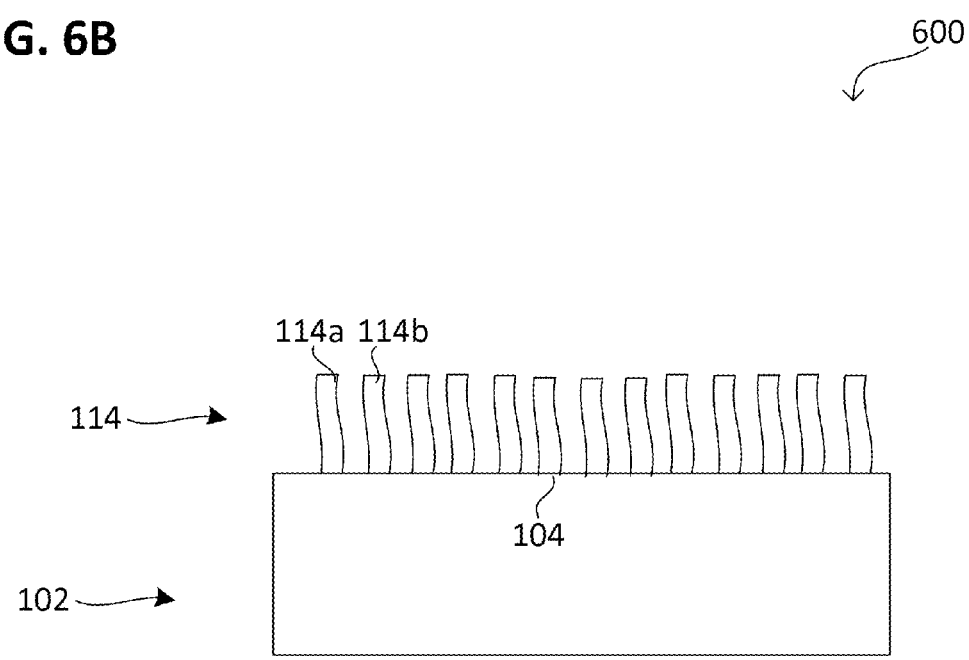

FIG. 6A and FIG. 6B respectively illustrate a radiation absorption layer 114 over the semiconductor region 102 according to various embodiments in a method according to various embodiments in a schematic side view 600. FIG. 6A illustrates a segmented radiation absorption layer 114 and FIG. 6B illustrates a continuous radiation absorption layer 114.

The segmented radiation absorption layer 114 may include or be formed from a plurality of separated segments 602a, 602b. Each segment of the plurality of separated segments 602a, 602b may include the plurality of protrusions 114a, 114b (e.g. provided by the plurality of carbon allotropes). Between adjacent segments of the plurality of separated segments 602a, 602b an opening 602o may be formed. The opening 602o may partially expose the semiconductor region 102. This may enable to adjust the heating distribution of (in other words, the distribution of the thermal energy transfer into) the semiconductor region 102. Illustratively, each segment of the plurality of separated segments 602a, 602b may be disposed over a segment of the semiconductor region 102, which are intended to be heated (e.g. to more than the dopant-activation temperature), e.g. which are intended to be activated.

Optional, at least two segments of the plurality of separated segments 602a, 602b differ in their reflection characteristic, e.g. in their reflection coefficient for a predefined wavelength (e.g. out of the absorbing range).

The continuous radiation absorption layer 114 may continuously cover the semiconductor region 102. Optionally, the continuous radiation absorption layer 114 may include or be formed from a plurality of adjoining segments 602a, 602b, e.g. configured as described before.

Figure 7A:
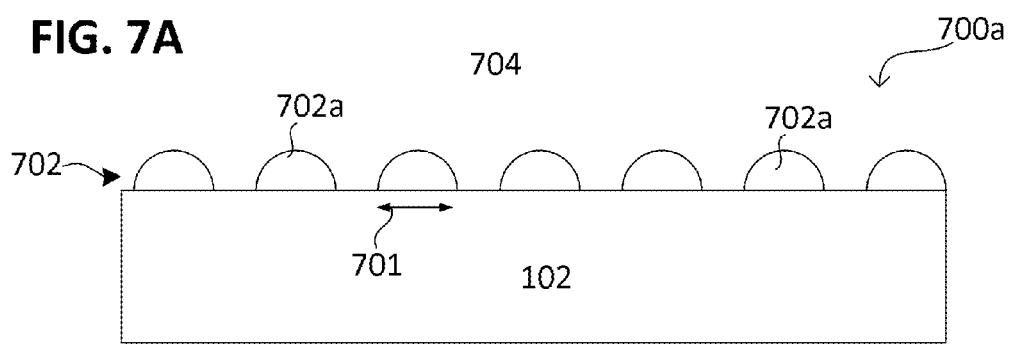
FIG. 7A, FIG. 7B and FIG. 7C respectively a radiation absorption layer according to various embodiments in a method according to various embodiments in a schematic side view FIG. 8A and FIG. 8B respectively show a semiconductor device according to various embodiments in a method according to various embodiments in a schematic cross sectional view or side view.
Figure 7B:
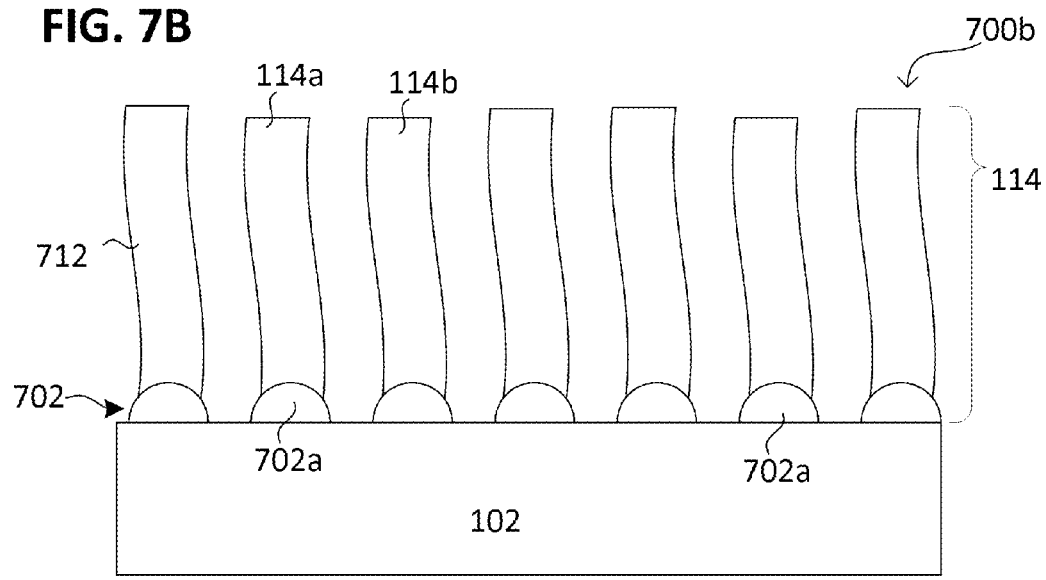
Figure 7C:
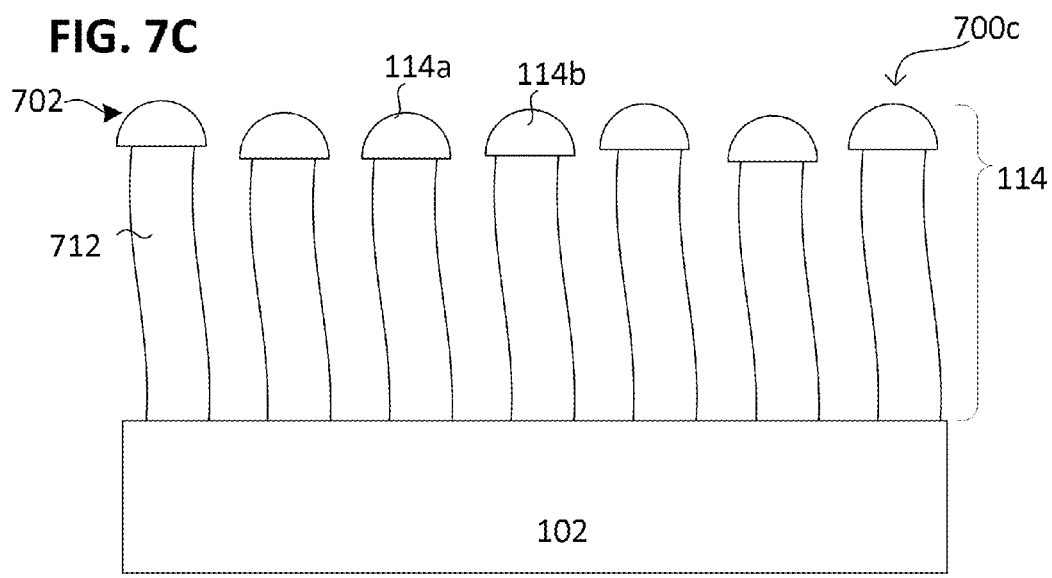

FIG. 7A to FIG. 7C respectively illustrate forming a radiation absorption layer 114 according to various embodiments in a method according to various embodiments in a schematic side view.

The method may include in 700a forming a catalyst layer 702 (may be also referred to as seed layer 702) over the semiconductor region 102. The catalyst layer 702 may include or be formed from a metallic material (may be also referred to as metallic catalyst), e.g. at least one of nickel, cobalt, yttrium and an alloy including cobalt and iron. The catalyst layer 702 may include or be formed from nanoparticles, e.g. including or formed from the metallic material. The catalyst layer 702 may include or be formed from a plurality of separated islands 702a. Each island 702a of the catalyst layer 702 may include or be formed from one or more nanoparticles, e.g. an accumulation of more than one nanoparticles. A lateral extension 701 (perpendicular to the macroscopic surface normal) of each island 702a of the catalyst layer 702 may be less than about 50 nm, e.g. less than about 10 nm, e.g. less than about 5 nm, e.g. less than about 1 nm.

According to various embodiments, the catalyst layer 702 may be formed by a physical vapor deposition, e.g. by sputtering.

According to various embodiments, a lateral extension (e.g. a diameter) of each island of the plurality of separated islands 702a may be less than or equal to about 50 nm, e.g. less than or equal to about 25 nm, less than or equal to about 10 nm, less than or equal to about 5 nm.

The method may include in 700a exposing the catalyst layer to a gaseous precursor 704. The gaseous precursor 704 (also referred to as carbon-containing gas) may include or be formed from molecules including carbon, e.g. at least one of as acetylene, ethylene, ethanol and methane. The gaseous precursor 704 may be provided in a mixture with a process gas, e.g. including or formed from at least one of ammonia, nitrogen and hydrogen. The structured surface 104 of the semiconductor region 102 may be heated during forming the radiation absorption layer 114, e.g. to more than about 500° C., e.g. to about 700° C.

According to various embodiments, the forming the radiation absorption layer 114 may include a chemical vapor deposition, e.g. using the gaseous precursor 704. Optionally, the forming the radiation absorption layer 114 may be enhanced, e.g. by plasma. Alternatively or additionally, the forming the radiation absorption layer 114 may include a physical vapor deposition, e.g. laser deposition or cathodic arc deposition.

According to various embodiments, the catalyst layer 702 may be configured to crack the gaseous precursor 704, e.g. via a pyrolytic decomposition (pyrolytically induced decomposition) of the gaseous precursor 704. The cracking the gaseous precursor 704o may provide carbon from the gaseous precursor 704. The carbon may accumulate to the islands 702a of the catalyst layer 702, e.g. by forming at least one allotrope 712 of carbon (also referred to as at least one carbon allotrope 712), e.g. carbon nanotubes radiation absorption layer 114 illustrated schematically in FIG. 7B. Alternatively or additionally, other types of allotropes 712 of carbon may be formed, e.g. at least one of graphite, fullerenes and carbon nanofoam.

The method may include in 700b forming the radiation absorption layer 114 in a first forming mode. The at least one carbon allotrope 712 of the radiation absorption layer 114 may be formed using the carbon from the gaseous precursor 704. The at least one carbon allotrope 712 may be formed over the catalyst layer 702. For example, each allotrope 712 of carbon may form a protrusion of the plurality of protrusions 114a, 114b. Illustratively, one or more carbon allotropes of the at least one allotrope 712 may growth on top of each island 702 of the catalyst layer 702.

The method may include in 700b forming the radiation absorption layer 114 in a second forming mode. The at least one carbon allotrope 712 of the radiation absorption layer 114 may be formed using the carbon from the gaseous precursor 704. The at least one allotrope 712 may be formed between the catalyst layer 702 and the semiconductor region 102. Illustratively, the at least one carbon allotrope 712 may lift the islands 702 of the catalyst layer 702.

Figure 8A:
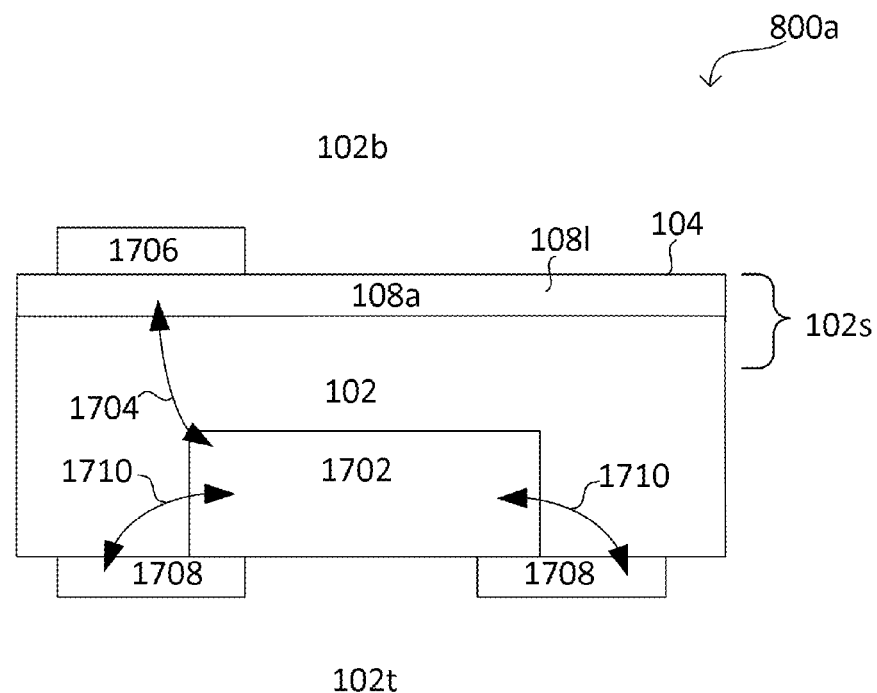

FIG. 8A illustrates a semiconductor device 800a according to various embodiments in a method according to various embodiments in a schematic cross sectional view or side view.

By activating the dopant, a doped layer 1081 may be formed in the semiconductor region 102 at a first side 102b of the semiconductor region 102 (see FIG. 1C and FIG. 2C). The first side 102b (also referred to as bottom side 102b) may be opposite a second side 102t of the semiconductor region 102 (also referred to as top side 102t). The activated dopant 108a may be disposed in a doped layer 1081 proximate to first side 102b (e.g. the surface 104) of the semiconductor region 102, e.g. in physical contact with the surface 104 of the semiconductor region 102. In other words, the semiconductor device 800a may include an activated dopant 108a disposed proximate to the surface 104, e.g. in physical contact with the surface 104 of the semiconductor region 102.

Optionally, the semiconductor device 800a may include a semiconductor circuit element 1702, e.g. a power semiconductor circuit element 1702, formed at least one of over or in the semiconductor region at a second side 102t of the semiconductor region. For example, the semiconductor circuit element 1702 may include or be formed from at least one transistor (in other words, one or more transistors, e.g. one or more insulated-gate bipolar transistors) in electrical contact 1704 to the doped layer 1081 of the semiconductor region 102.

Optionally, the semiconductor device 800a may include at least one first contact pad 1706 (e.g. at least one collector contact pad 1706) formed in electrical contact with the doped layer 1081 of the semiconductor region 102. In other words, the at least one first contact pad 1706 may be electrically connected to the semiconductor circuit element 1702 via the doped layer 1081. Alternatively or additionally, the semiconductor device 800a may include at least one second contact pad 1708 (e.g. a source/drain contact pad 1708), in other words, one or more second contact pads 1708, on the second side 102t formed in electrical contact 1710 to the semiconductor circuit element 1702. The more than one second contact pads 1708 may optionally include a gate contact pad, e.g. which may be formed electrically insulated from the semiconductor region 102.

Figure 8B:
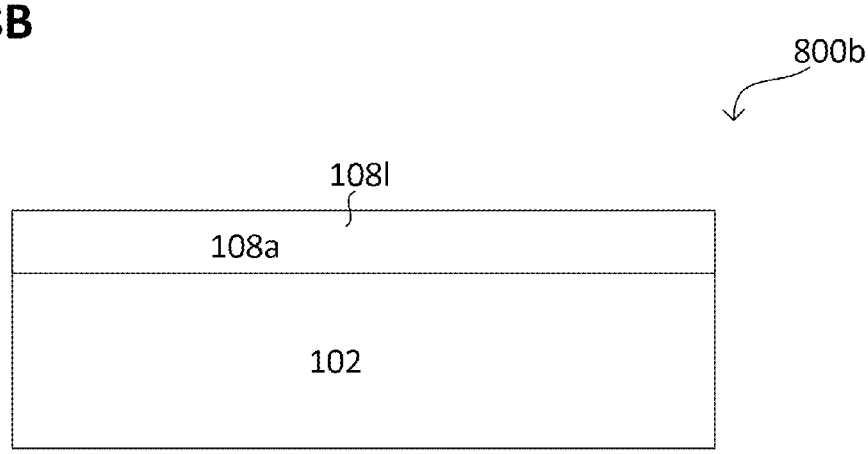

FIG. 8B illustrates a semiconductor device 800b according to various embodiments in a method according to various embodiments in a schematic cross sectional view or side view.

According to various embodiments, the method may include removing the radiation absorption layer 114. Removing the radiation absorption layer 114 may include or be formed from at least one of chemical processing and heat processing.

The chemical processing may include or be formed from at least one of wet chemical etching and dry chemical etching (e.g. plasma etching).

For example, the at least one carbon allotrope 712 of the radiation absorption layer 114 may be removed by plasma ashing. For plasma ashing, a plasma source may provide a plasma (e.g. a monatomic plasma) to which the radiation absorption layer 114 is exposed. For example, the plasma may include or be formed from at least one of oxygen and fluorine. The plasma (also referred to as reactive species) may chemically react with the at least one carbon allotrope 712 of the radiation absorption layer 114 to form an ash, which may be further removed by a vacuum pump. During plasma ashing, optionally heat may be applied to the radiation absorption layer 114.

During the removing the radiation absorption layer 114, the semiconductor device 800b may be oriented with the radiation absorption layer 114 facing the gravitational force. This may enable that the islands 712 of the catalyst layer 702 (see for example, the second forming mode in FIG. 7C) may fall of when their connection to the semiconductor region 102 is lost. Illustratively, this may facilitate cleaning the semiconductor region 102.

Alternatively or additionally, the removing the radiation absorption layer 114 may include a wet etching process to remove the islands 712 of the catalyst layer 702.

Figure 9:
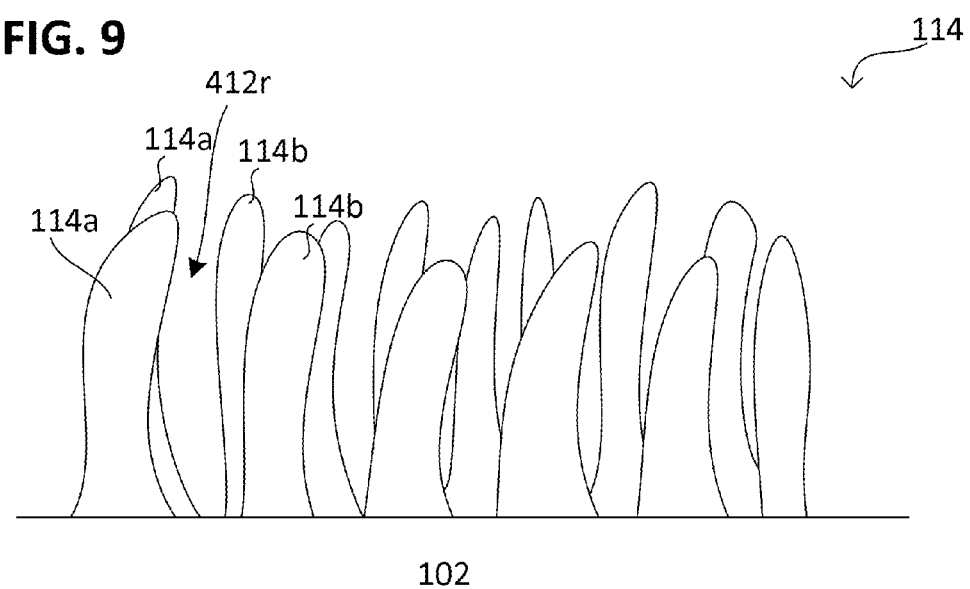
FIG. 9 shows a radiation absorption layer according to various embodiments in a method according to various embodiments in a schematic perspective view.

FIG. 9 illustrates the radiation absorption layer 114 according to various embodiments in a method according to various embodiments in a schematic perspective view.

According to various embodiments, the radiation absorption layer 114 may include or be formed from a wood-like structure (e.g., a wood of CNTs). The wood-like structure may include or be formed from a plurality of protrusions 114a, 114b, e.g. in tube form (plurality of tubes 114a, 114b), disposed distant from each other. The wood-like structure may include or be formed from carbon nanotubes. Each protrusion of the plurality of protrusions 114a, 114b may be extended away from the semiconductor region 102, e.g. in a direction perpendicular to the macroscopic surface normal 404n of the semiconductor region 102. The extension of each protrusion of the plurality of protrusions 114a, 114b may be greater than at least one of a distance between them or an extension of them parallel to the macroscopic surface normal 404n of the semiconductor region 102. In other words, each protrusion of the plurality of protrusions 114a, 114b may be elongated. Optionally, each protrusion of the plurality of protrusions 114a, 114b may include a hollow surrounded by at least one wall. For example, the carbon nanotubes may be single-walled or multi-walled, e.g. double-walled.

Figure 10A:
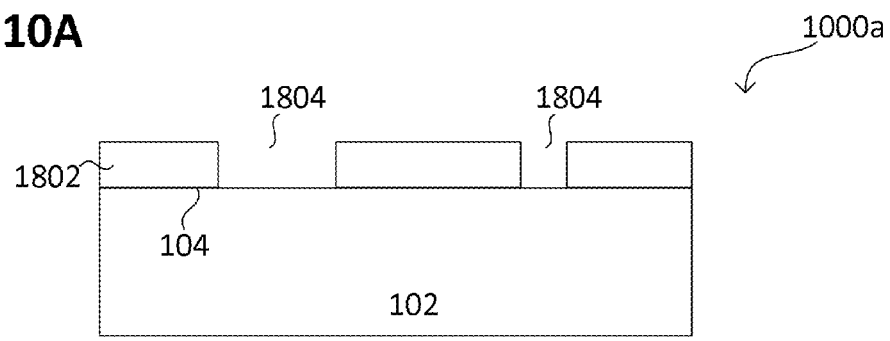
FIG. 10A, FIG. 10B and FIG. 10C respectively show a semiconductor device according to various embodiments in a method according to various embodiments in a schematic cross sectional view or side view.

FIG. 10A illustrates a semiconductor device 1000a according to various embodiments in a method according to various embodiments in a schematic cross sectional view or side view.

According to various embodiments, structuring the radiation absorption layer 114 may include using a mask 1802. Therefore, the mask 1802 may be formed over the semiconductor region 102, e.g. over the surface 104 of the semiconductor region 102. The mask 1802 may be formed before forming the radiation absorption layer 114. The mask 1802 may include a plurality of openings 1804 exposing the semiconductor region 102, e.g. the surface 104 of the semiconductor region 102.

According to various embodiments, the openings of the plurality of openings 1804 may be arranged in a pattern, e.g. periodically (e.g. in two dimensions), e.g. in a chessboard structure. According to various embodiments, the mask 1802 may include or be formed from an oxide, e.g. at least one of a semiconductor oxide, a metal oxide and a polymer, e.g. photoresist or another resist.

According to various embodiments, the radiation absorption layer 114 may be formed over the mask 1802. After forming the radiation absorption layer 114, the mask 1802 may be removed together with portions of the radiation absorption layer 114 disposed over the material of the mask 1802 (also referred to as lift-off process).

According to various embodiments, a lift-off process may include forming a sacrificial layer (e.g. which may include or be formed from a polymer, e.g. photoresist or another resist) over the semiconductor region 102; structuring the sacrificial layer to provide the mask 1802; forming the radiation absorption layer 114 over the mask 1802 (and the semiconductor region 102); removing the mask 1802 such that at least one portion of the radiation absorption layer 114 remains over the semiconductor region 102. Illustratively, when the mask 1802 is removed (e.g. using a mask removing agent, e.g. including at least one of a solvent or an etchant) at least one portion of the radiation absorption layer 114 which are separated from the semiconductor region 102 by the mask 1802 are lifted-off and removed together with the mask 1802 below. After the lift-off process, the at least one further portion of the radiation absorption layer 114 may remain over regions of the semiconductor region 102, which were exposed by the plurality of openings 1804, e.g. in which the radiation absorption layer 114 and the semiconductor region 102 are in physical contact with each other. Illustratively, the at least one further portion of the radiation absorption layer 114 remaining over the semiconductor region 102 includes an inverted structure of the mask 1802.

Figure 11A:
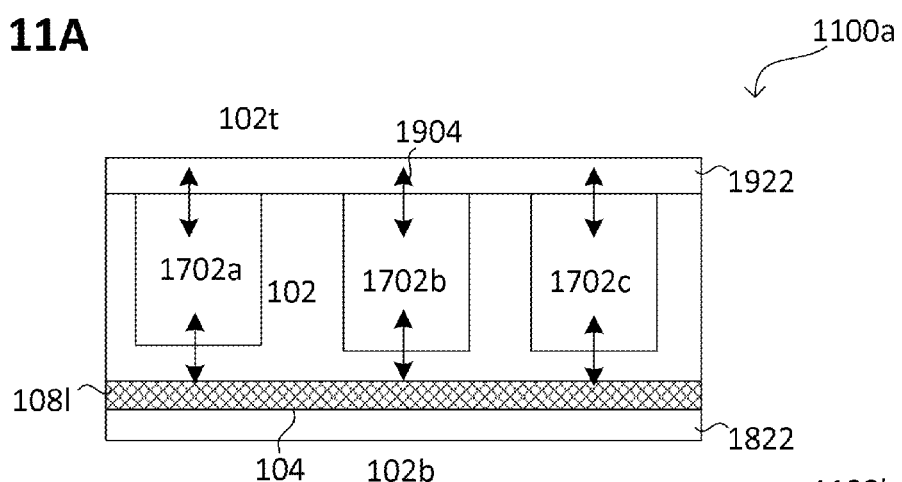
FIG. 11A, FIG. 11B and FIG. 11C respectively show a semiconductor device according to various embodiments in a method according to various embodiments in a schematic cross sectional view or side view.
Figure 11B:
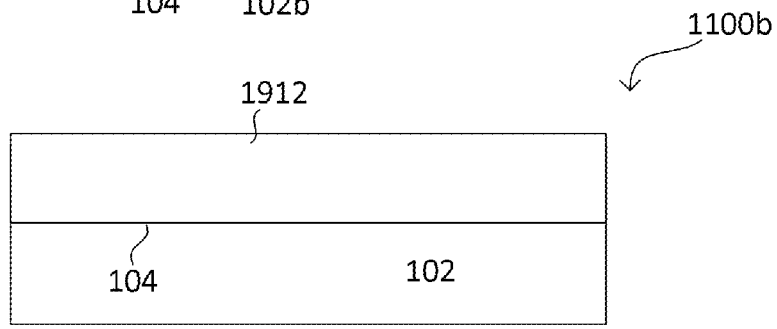
Figure 11C:
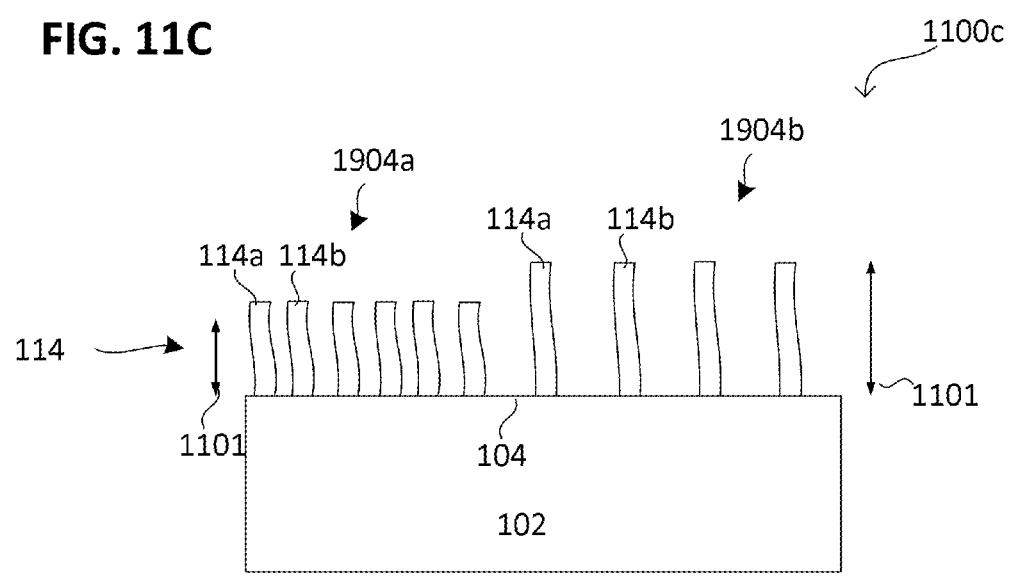

For example, the mask 1802 may be configured to form a first region 1904a and a second region 1904b differing in their reflection characteristic (see FIG. 11C or see FIG. 5A and FIG. 5B). By way of example, via a first lift-off process, a first catalyst layer may be formed. Further, via a second lift-off process, a second catalyst layer may be formed. The first catalyst layer and the second catalyst layer may differ from each other, e.g. in at least one of: island density (number per area), the metallic material, lateral extension of the island, and nanoparticle density.

Figure 10B:
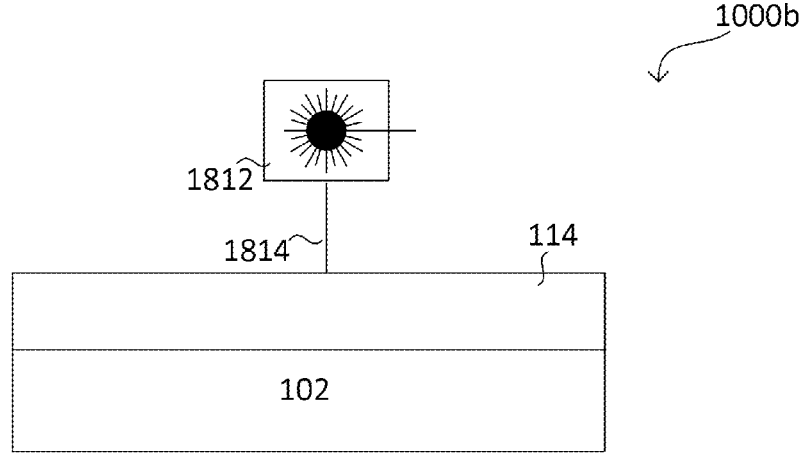

FIG. 10B illustrates a semiconductor device 1000b according to various embodiments in a method according to various embodiments in a schematic cross sectional view or side view.

According to various embodiments, activating the dopant may include or be formed from irradiating the radiation absorption layer 114 using a laser source 1812 (laser light source). The laser source 1812 may be configured to provide a laser beam 1814 including electromagnetic radiation (e.g. laser light) which is optionally coherent.

According to various embodiments, the laser source 1812 may be configured to provide a pulsed laser beam 1814. Alternatively or additionally, the laser source 1812 may be configured to provide a continuous laser beam 1814.

According to various embodiments, irradiating the radiation absorption layer 114 may include or be formed from scanning the radiation absorption layer 114 with the electromagnetic radiation, e.g. the laser beam 1814. In other words, the electromagnetic radiation, e.g. the laser beam 1814, may be moved over the radiation absorption layer 114, e.g. in accordance with a predetermined irradiation pattern.

The laser beam 1814 may include or be formed from (e.g. per pulse) an energy density in the range from about 2 J/cm$^2$ to about 10 J/cm$^2$, in the range from about 3 J/cm$^2$ to about 5 J/cm$^2$.

Figure 10C:
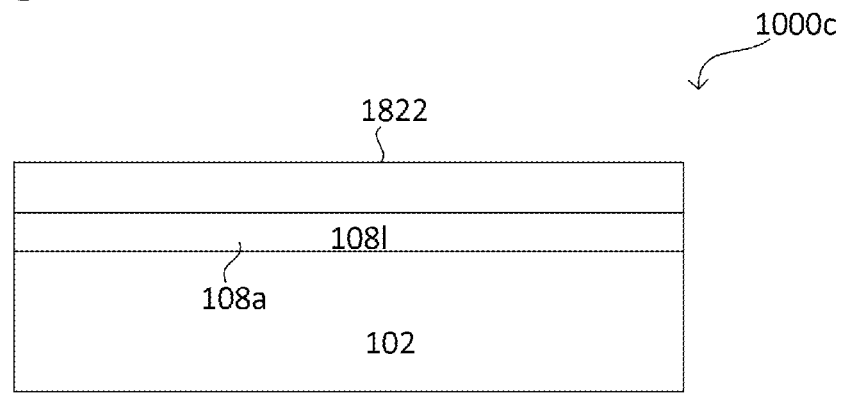

FIG. 10C illustrates a semiconductor device 1000c according to various embodiments in a method according to various embodiments in a schematic cross sectional view or side view.

According to various embodiments, the semiconductor device 1000c may include a metallization layer 1822 formed over the semiconductor region 102, e.g. over the activated dopant 108a. The metallization layer 1822 may include or be formed from a metallic material, e.g. copper. The metallization layer 1822 may include or be formed from at least one contact pad. According to various embodiments, the metallization layer 1822, e.g. the at least one contact pad, may include or be formed from an opaque material. In other words, the metallization layer 1822, e.g. the at least one contact pad, may be opaque.

FIG. 11A illustrates a semiconductor device 1100a according to various embodiments in a method according to various embodiments in a schematic cross sectional view or side view.

According to various embodiments, the semiconductor device 1100a may include a plurality of semiconductor circuit elements 1702a, 1702b, 1702c electrically connected 1904 in parallel to each other and in electrical contact with the doped layer 1081 of the semiconductor region 102. By way of example, the plurality of semiconductor circuit elements 1702a, 1702b, 1702c may be part of or form a power semiconductor circuit element.

Optionally, the semiconductor device 1100a may include a first metallization 1922 on the second side 102t of the semiconductor region 102. Each semiconductor circuit element of the plurality of semiconductor circuit elements 1702a, 1702b, 1702c may be electrically connected 1904 to the first metallization 1922. The at least one second contact pad 1708 may be formed from the first metallization 1922.

According to various embodiments, each semiconductor circuit element of the plurality of semiconductor circuit elements 1702a, 1702b, 1702c may include or be formed from a diode structure or a transistor structure (also referred to as transistor cell).

Optionally, the semiconductor device 1100a may include a second metallization 1822 on the first side 102b of the semiconductor region 102. Each semiconductor circuit element of the plurality of semiconductor circuit elements 1702a, 1702b, 1702c may be electrically connected 1904 to the second metallization 1822, e.g. via the activated dopant 108a (e.g. via the doped layer 1081) of the semiconductor region 102. The at least one first contact pad 1706 may be formed from the second metallization 1822.

According to various embodiments, each semiconductor circuit element of the plurality of semiconductor circuit elements 1702a, 1702b, 1702c (e.g. the power semiconductor circuit element) may include or be formed from a vertical structure. A vertical structure may be understood as providing a current flow from the second side 102t of the semiconductor region 102 to the first side 102b of the semiconductor region 102 or vice versa, e.g. perpendicular to a macroscopic surface plane 404 of the semiconductor region 102.

According to various embodiments, each semiconductor circuit element of the plurality of semiconductor circuit elements 1702a, 1702b, 1702c (e.g. the power semiconductor circuit element) may include at least one gate contact pad. The at least one gate contact pad may be provided by (e.g. formed from) at least one of (if present) the first metallization 1922.

According to various embodiments, each semiconductor circuit element of the plurality of semiconductor circuit elements 1702a, 1702b, 1702c (e.g. the power semiconductor circuit element) may include or be formed from a transistor (e.g. a power transistor).

FIG. 11B illustrates a semiconductor device 1100b according to various embodiments in a method according to various embodiments in a schematic cross sectional view or side view.

According to various embodiments, the semiconductor device 1100b may include a sacrificial layer 1912 formed over the semiconductor region 102, e.g. before forming the radiation absorption layer 114 and/or after disposing the dopant in the semiconductor region 102. The sacrificial layer 1912 may be processed to form the mask 1812.

Alternatively or additionally, the sacrificial layer 1912 may facilitate removing the radiation absorption layer 114. In this case, a transparency (e.g. a transparence coefficient) of the sacrificial layer 1912 may greater than a transparency (e.g. a transparence coefficient) of the semiconductor region 102. Alternatively or additionally, a thermal conductivity of the sacrificial layer 1912 may be greater than a thermal conductivity of the semiconductor region 102. The sacrificial layer 1912 may be removed together with the radiation absorption layer 114 after activating the dopant (similar to the lift-off process).

Alternatively or additionally, the sacrificial layer 1912 may include or be formed from an antireflective coating (e.g. including at least one antireflective layer). The antireflective coating may be configured to reduce the reflectivity of the semiconductor region 102, e.g. the surface 104 of the semiconductor region 102. In other words, a reflection coefficient of the antireflective coating may be less than a reflection coefficient of the semiconductor region 102.

FIG. 11C illustrates a semiconductor device 1100c according to various embodiments in a method according to various embodiments in a schematic cross sectional view or side view.

According to various embodiments, forming the radiation absorption layer 114 may include forming at least two regions 1904a, 1904b (e.g. the segments 602a, 602b) differing from each other, e.g. at least in their reflectance characteristic (e.g. for a given wavelength or a range of wavelengths), for example, describing a wavelength dependent reflection coefficient (see FIG. 5A and FIG. 5B). By way of example, the at least two regions 1904a, 1904b may include or be formed from a first region 1904a and a second region 1904b.

According to various embodiments, the first region 1904a of the radiation absorption layer 114 and the second region 1904b of the radiation absorption layer 114 may differ in at least one structural feature selected from the following structural features: a roughness (root mean squared), a type of carbon allotrope 712 (e.g. also single-walled or multi-walled), a spatially averaged structure height 1101 (referring to the thickness 1101 of the respective region 1904a, 1904b or the extension of the carbon allotropes 712 parallel to the macroscopic surface normal) and a density of carbon allotropes 712 (e.g. number per area).

According to various embodiments, the height 1101 of the at least one carbon allotrope may be in the range from about 0.1 µm to about 10 µm, in the range from about 0.1 µm to about 1 µm, e.g. about 0.5 µm.

The first region 1904a and the second region 1904b may provide to modulate the absorption by the radiation absorption layer 114, e.g. in accordance with a predetermined pattern or modulation. In other words, structuring the radiation absorption layer 114 may include adjusting a spatially distributed reflectance. This may enable to adjust the spatially resolved energy transfer to the semiconductor region 102, e.g. via the radiation absorption layer 114.

Figure 12A:
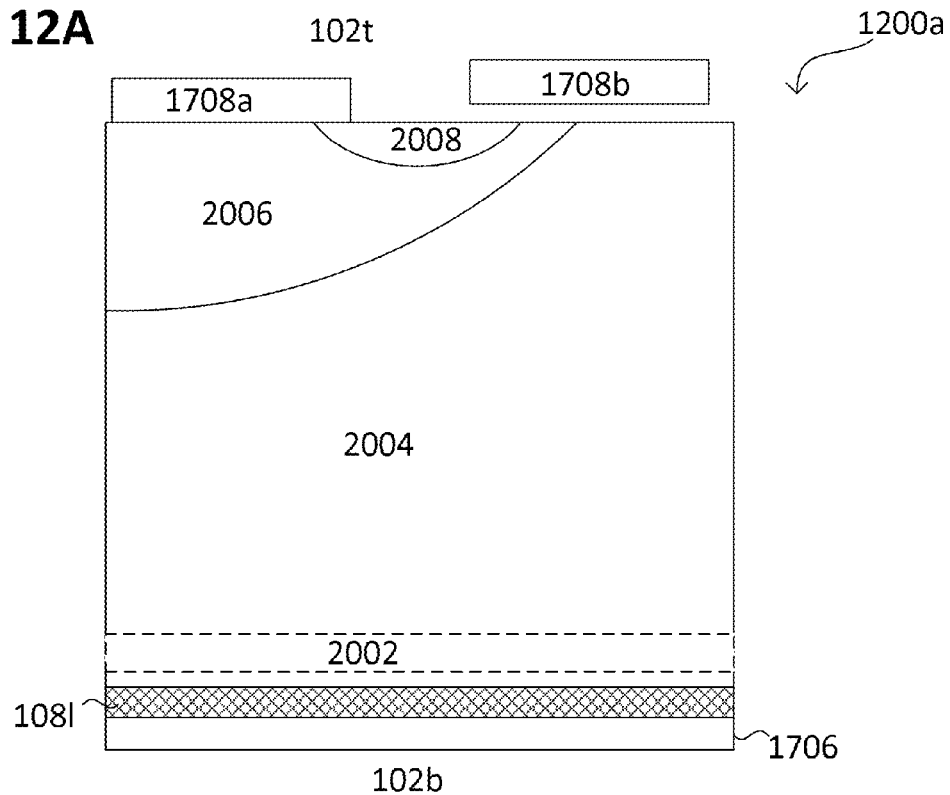
FIG. 12A and FIG. 12B respectively show a semiconductor device according to various embodiments in a method according to various embodiments in a schematic cross sectional view or side view.

FIG. 12A illustrates a semiconductor device 1200a according to various embodiments in a method according to various embodiments in a schematic cross sectional view (e.g. in the schematic cross sectional view 2106, see FIG. 21) or side view, e.g. a semiconductor circuit element 1702a, 1702b, 1702c, e.g. a power semiconductor circuit element 1702.

The semiconductor device 1200a may include the doped layer 1081 formed on the first side 102b. The doped layer 1081 (in other words, the activated dopant) may include or be formed from a first doping type. The doped layer 1081 may include or be formed from a collector region (a doped region in form of a collector region).

The semiconductor device 1200a may further include a first contact pad 1706 first contact pad 1706 in form of a collector contact pad 1706 (e.g. a drain contact pad). The first contact pad 1706 may electrical contact the doped layer 1081. The first contact pad 1706 may include or be formed from a metallization layer. The first contact pad 1706 may cover more than half of the doped layer 1081, cover the doped layer 1081 substantially (e.g. more than 80% of the doped layer 1081). The first contact pad 1706 may include or be formed from an opaque layer.

Further, the semiconductor device 1200a may include a first doped region 2006. The first doped region 2006 may include or be formed from a base region. The first doped region 2006 may include (e.g. a dopant having) a doping type equal to the doped layer 1081 (in other words, the dopant of the doped layer 1081), e.g. the first doping type. The semiconductor device 1200a may further include a second contact pad 1708a electrical contacting the first doped region 2006. The second contact pad 1708a may include or be formed from an emitter contact pad 1708a (e.g. a source contact pad 1708a). The second contact pad 1708a may include or be formed from a metallization layer.

Further, the semiconductor device 1200a may include a second doped region 2004 formed between the first doped region 2006 and the doped layer 1081. The second doped region 2004 may include or be formed from a drift region. The second doped region 2004 may include a doping type (second doping type) different from the doped layer 1081, e.g. a dopant having the second doping type. The second doped region 2004 may include an epitaxial formed layer.

The semiconductor device 1200a may further include a further second contact pad 1708b. The further second contact pad 1708b may include or be formed from a gate contact pad 1708b. The further second contact pad 1708b may be formed electrical insulated from the second doped region 2004, e.g. by an electrically insulating layer formed between the further second contact pad 1708b and the second doped region 2004. The further second contact pad 1708b may include or be formed from a metallization layer.

Further, the semiconductor device 1200a may include a third doped region 2008. The third doped region 2008 may include or be formed from an emitter region. The third doped region 2008 may include (e.g. a dopant having) a doping type different from the doped layer 1081, e.g. the second doping type. A dopant concentration of the third doped region 2008 may be greater than of the second doped region 2004.

Optionally, the semiconductor device 1200a may include a fourth doped region 2002 between the second doped region 2004 and the doped layer 1081. The fourth doped region 2002 may include or be formed from a field stop region. The fourth doped region 2002 may include a dopant having a doping type different from the doped layer 1081. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

Optionally, the doped layer 1081 may include or be formed from a plurality of first segments including the first doping type and a plurality of second segments including the second doping type. In other words, the plurality of first segments may include a doping type different from the doping type of the plurality of second segments. The segments of the plurality of first segments and the segments of the plurality of second segments may be disposed in an alternating order, e.g. adjacent to each other.

The semiconductor device 1200a, e.g. a semiconductor circuit element 1702 may include or be formed from a transistor structure, e.g. a planar transistor structure (providing a vertical current flow). A transistor structure may include or be formed from a plurality of p-n junctions. A p-n junction may be formed by an interface of two doped regions having different doping types, e.g. an interface between at least one the following: the first doped region 2006 and the second doped region 2004; the first doped region 2006 and the third doped region 2008; the second doped region 2004 and the doped layer 1081; the doped layer 1081 and the fourth doped region 2002 (if present, e.g. in an IGBT).

According to various embodiments, the second doped region 2004 and the fourth doped region 2002 may include the same doping type. As described above, the doped layer 1081 may differ from the second doped region 2004 and the fourth doped region 2002 in the doping type. In this case, the doped layer 1081 may provide a backside emitter region (e.g. for an IGBT). Alternatively, the doped layer 1081 may have the same doping type as the second doped region 2004 and the fourth doped region 2002. In this case, the doped layer 1081 may provide a contact enhancement region (e.g. for a vertical metal-oxide-semiconductor field-effect transistor).

According to various embodiments, the semiconductor device 1200a, e.g. a semiconductor circuit element 1702, may include or be formed from insulated-gate bipolar transistor.

Figure 12B:
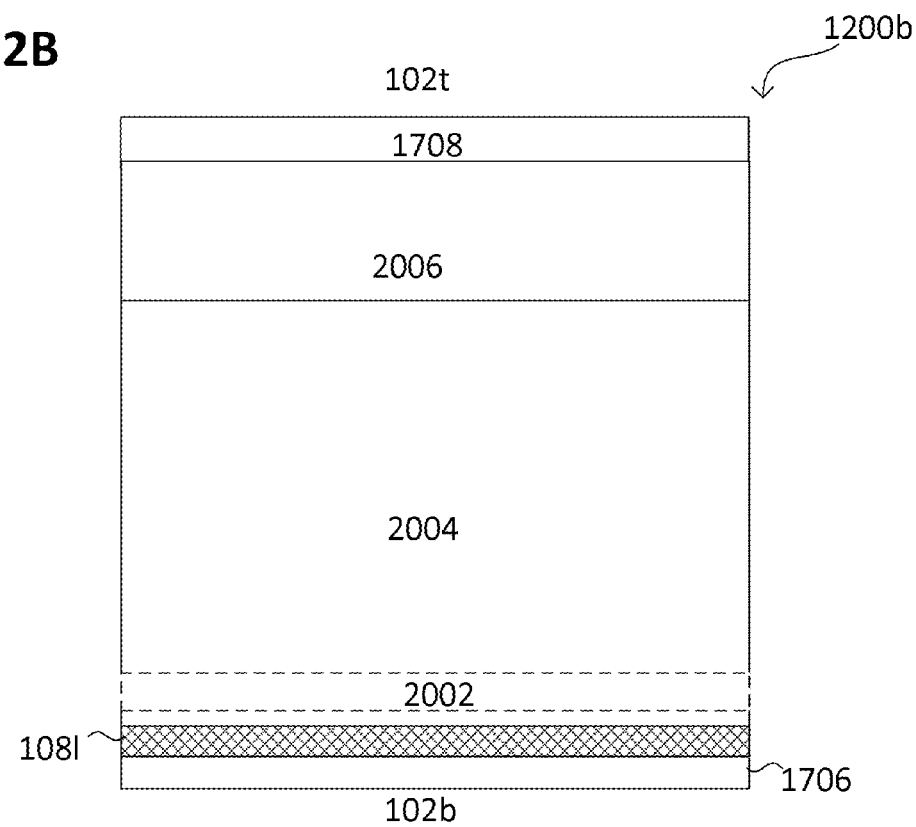

FIG. 12B illustrates a semiconductor device 1200b according to various embodiments in a method according to various embodiments in a schematic cross sectional view (e.g. in the schematic cross sectional view 2106, see FIG. 21) or side view, e.g. a semiconductor circuit element 1702a, 1702b, 1702c, e.g. a power semiconductor circuit element 1702.

The semiconductor device 1200b may include the doped layer 1081 formed on the first side 102b. The doped layer 1081 (in other words, the activated dopant) may include or be formed from a first doping type.

The semiconductor device 1200b may further include a first contact pad 1706 electrically contacting the doped layer 1081. The first contact pad 1706 may include or be formed from an electrode contact pad. The first contact pad 1706 may include or be formed from a metallization layer. The first contact pad 1706 may substantially cover the doped layer 1081. An extension of the first doped region 2006 (e.g. in a direction pointing from the second side 102t to the first side 102b, in other words, a vertical direction) may be less than an extension of the second doped region 2004 (e.g. in the direction pointing from the second side 102t to the first side 102b). Illustratively, the first doped region 2006 may provide a thin doped region and/or the second doped region 2004 may provide a thick drift zone. The first doped region 2006 may be electrically and/or physically connected with a second contact pad 1708.

Further, the semiconductor device 1200b may include a first doped region 2006. The first doped region 2006 may include or be formed from a first junction region. The first doped region 2006 may include a dopant having a doping type different from the doped layer 1081 (in other words, the dopant of the doped layer 1081), e.g. the second doping type. The semiconductor device 1200b may further include the second contact pad 1708 electrical contacting the first doped region 2006. The second contact pad 1708 may include or be formed from an electrode contact pad. The second contact pad 1708a may include or be formed from a metallization layer. Further, the semiconductor device 1200b may include a second doped region 2004 formed between the first doped region 2006 and the doped layer 1081. The second doped region 2004 may include or be formed from a second junction region. The second doped region 2004 may include a doping type equal to a doping type of the doped layer 1081, e.g. a dopant having the first doping type.

Optionally, the semiconductor device 1200b may include a third doped region 2002 between the second doped region 2004 and the doped layer 1081. The third doped region 2002 may include or be formed from a field stop region. The third doped region 2002 may include (e.g. a dopant having) a doping type equal to a doping type of the doped layer 1081. The third doped region 2002 may include a dopant concentration higher than the second doped region 2004.

The semiconductor device 1200b, e.g. a semiconductor circuit element 1702, e.g. a power semiconductor circuit element may include or be formed from a diode structure, e.g. a planar diode structure (providing a vertical current flow). A diode structure may include or be formed from a p-n junction, e.g. formed by an interface of two doped regions having different doping types, e.g. an interface between the first doped region 2006 and the second doped region 2004.

Optionally, the doped layer 1081 may include or be formed from a plurality of first segments including the first doping type and a plurality of second segments including the second doping type. The segments of the plurality of first segments and the segments of the plurality of second segments may be disposed in an alternating order. In this case, the doped layer 1081 may be part of backward-diode structure.

Figure 13:
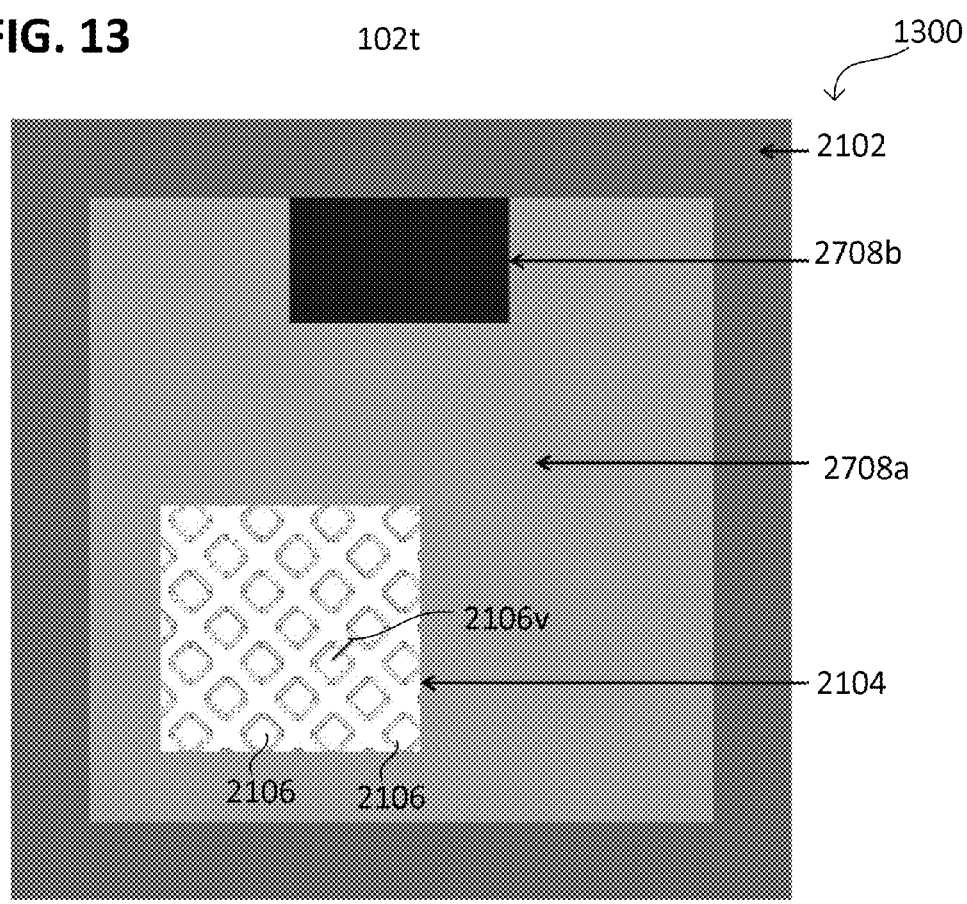
FIG. 13 shows a semiconductor device according to various embodiments in a method according to various embodiments in a schematic top view.

FIG. 13 illustrates a semiconductor device 1300 according to various embodiments in a method according to various embodiments in a schematic top view (showing the top side of the semiconductor device 1300).

The device may include a first contact terminal 2708a and a second contact terminal 2708b. The second contact terminal 2708a may cover an active area of the semiconductor device 1300 in which a plurality of semiconductor circuit elements 2106 (e.g. transistor structures or diode structures) may be disposed, as visible in a detailed (magnified) top view 2104.

The first contact terminal 2708a (e.g. a source contact terminal 2708a) may be electrically connected to the second contact pad 1708a (e.g., a source contact pad 1708a) of each semiconductor circuit element of the plurality of semiconductor circuit elements 2106. The second contact terminal 2708b (e.g. a gate contact terminal 2708b) may be electrically connected to the further second contact pad 1708b (e.g., the gate contact pad 1708b) of each semiconductor circuit element of the plurality of semiconductor circuit elements 2106. Therefore, the plurality of semiconductor circuit elements 2106 may be connected in parallel.

Each semiconductor circuit element of the plurality of semiconductor circuit elements 2106 may be in shape of a stripe cell or a quadratic cell, optionally including a trench structure (see FIG. 15B) for the gate terminal, as described in the following. For example, each semiconductor circuit element of the plurality of semiconductor circuit elements 2106 may include or be formed from an insulated-gate bipolar transistor (IGBT), e.g. a field stop IGBT (including a field stop region).

The device may include an edge-termination structure 2102, which may be electrically insulated to the second contact terminal 2708b. The edge-termination structure 2102 may be electrically connected from the first contact terminal 2708a.

Figure 14:
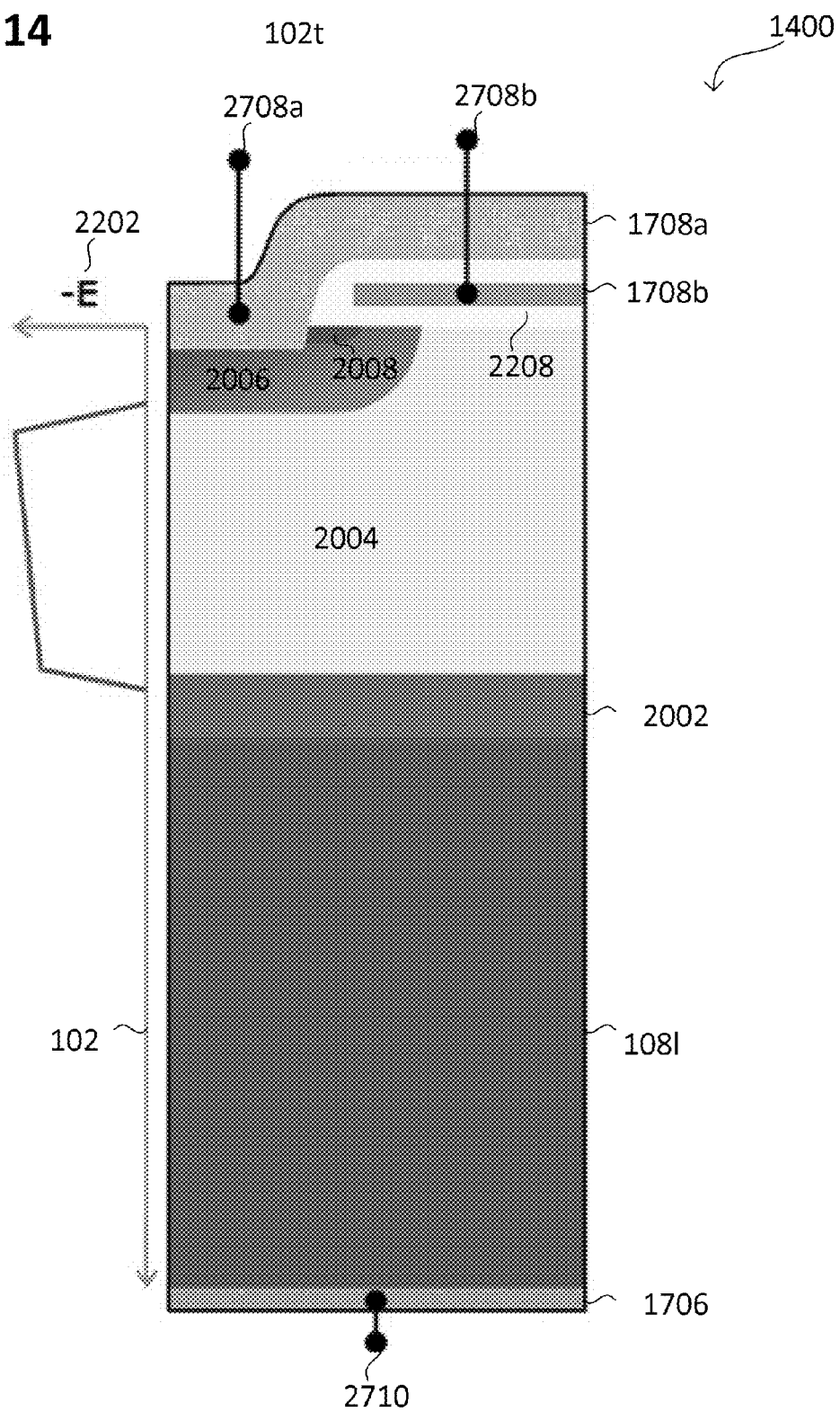
FIG. 14 shows a semiconductor device according to various embodiments in a method according to various embodiments in a schematic cross sectional view.

FIG. 14 illustrates a semiconductor device 1400 according to various embodiments in a method according to various embodiments in a schematic cross sectional view, e.g. in the schematic cross sectional view 2106v (see FIG. 21), similar to semiconductor device 1200a, showing an electrical field distribution 2202 over the semiconductor region 102. The at least one first contact pad 1706 may be electrically connected to a third contact terminal 2710 (e.g. a collector terminal 2710).

The semiconductor device 1400 may include or be formed from a punch trough structure.

The further second contact pad 1708b may be formed electrical insulated from the second doped region 2004, e.g. by an electrically insulating layer 2208 formed between the further second contact pad 1708b and the second doped region 2004 and 2208 formed between the further second contact pad 1708b and the second contact pad 1708a.

Figure 15A:
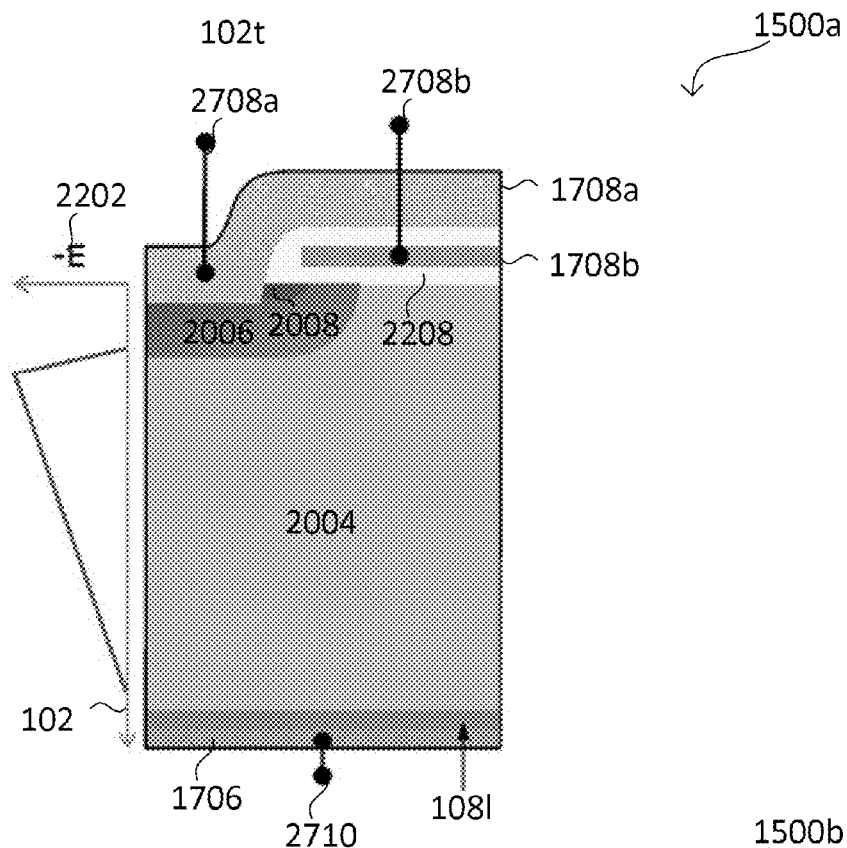
FIG. 15A and FIG. 15B respectively show a semiconductor device according to various embodiments in a method according to various embodiments in a schematic cross sectional view or side view.
Figure 15B:
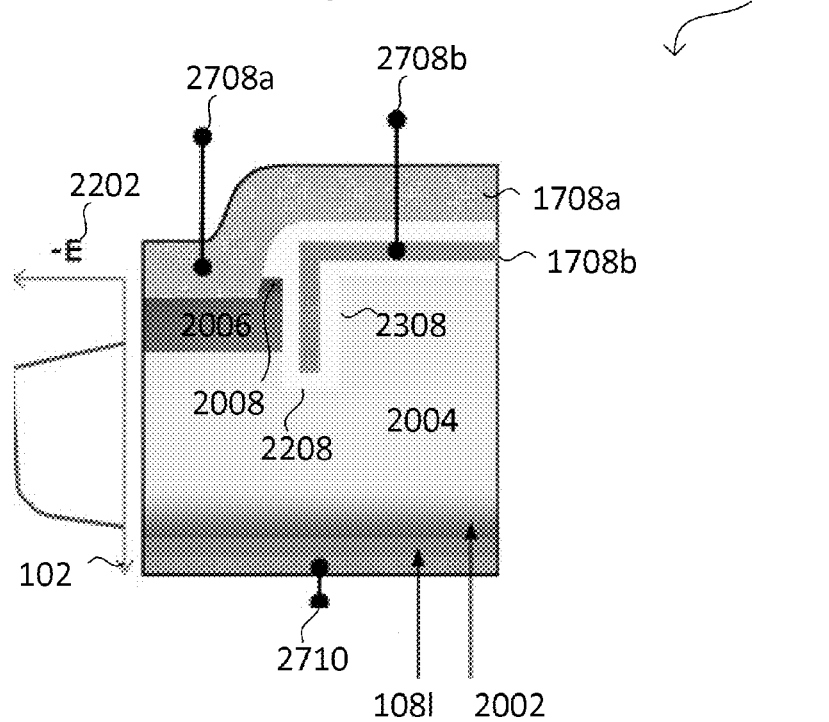

FIG. 15A and FIG. 15B respectively show a semiconductor device 1500a, 1500b according to various embodiments in a method according to various embodiments in a schematic cross sectional view, e.g. in the schematic cross sectional view 2106v (see FIG. 21).

The semiconductor device 1500a may include or be formed from a non-punch trough structure. The semiconductor device 1500b may include or be formed from a trench-and-field stop structure.

The second doped region 2004 may be part of a substrate (e.g. a semiconductor substrate), having a second doping type (e.g. an n-type doping type). The doped layer 1081 may be formed in the substrate, e.g. by dopant implantation. The doped layer 1081 may provide at least one of a better adjustability of the semiconductor device 1500a, 1500b, lower switching losses, a higher switching robustness, and direct current functionality. For example, the doping concentration of the doped layer 1081 may define a voltage drop of the semiconductor device 1500a, 1500b in conducting mode. The doped layer 1081 may provide a backside emitter.

According to various embodiments, the semiconductor device 1500b may include a trench structure 2308, in which the further second contact pad 1708b (e.g., a gate contact pad 1708b) may be extended. In other words, the further second contact pad 1708b may extend into the second doped region 2004, e.g. between the first doped region 2006 and the second doped region 2004.

The fourth doped region 2002 may be formed in the substrate, e.g. by dopant implantation. The fourth doped region 2002 may be formed between the doped layer 1081 and the second doped region 2004. The fourth doped region 2002 may enable to reduce the thickness of the second doped region 2004 (e.g. including or formed from a base region) without reducing a robustness of the semiconductor device 1500b. According to various embodiments, a robustness of the semiconductor device 1500b may be comparable to the semiconductor device 1500a. Further, the fourth doped region 2002 may reduce a collector-emitter saturation voltage (VCEsat).

The first doped region 2006 may include or be formed from a highly doped semiconductor region having a first doping type (e.g. p-doping type). The doped layer 1081 may include or be formed from a highly doped semiconductor region having the first doping type. The second doped region 2004 may include or be formed from a low doped semiconductor region having a second doping type. The third doped region 2008 and the fourth doped region 2002 respectively the may include or be formed from a highly doped semiconductor region having a second doping type. The low doped region may include a lower doping concentration than the highly doped region.

Figure 16A:
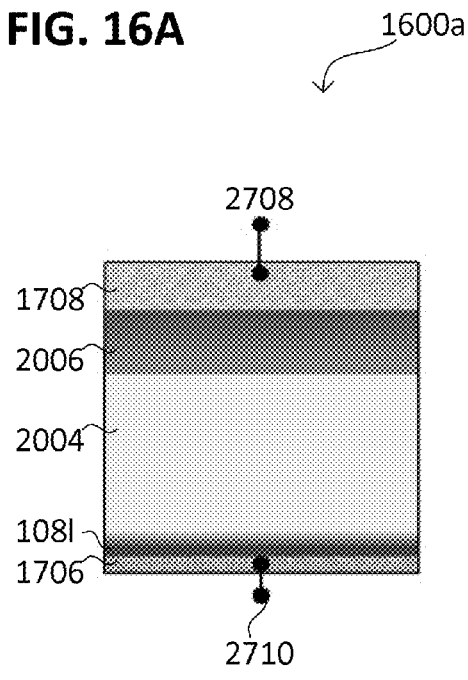
FIG. 16A, FIG. 16B and FIG. 16C respectively show a semiconductor device according to various embodiments in a method according to various embodiments in a schematic cross sectional view or side view.
Figure 16B:
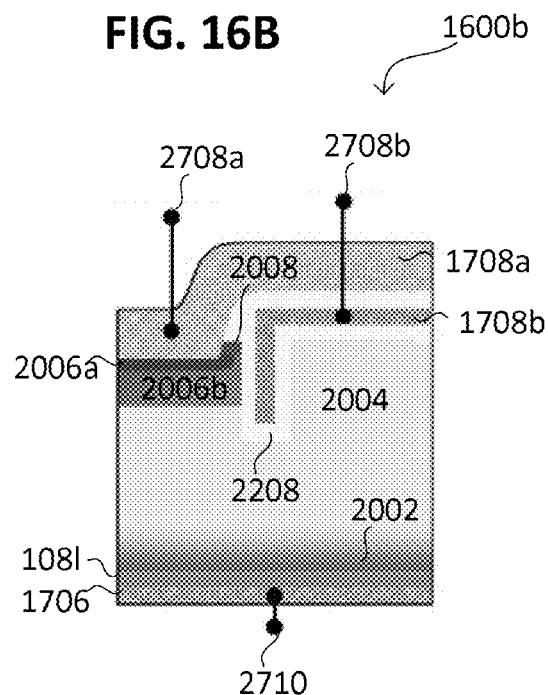
Figure 16C:
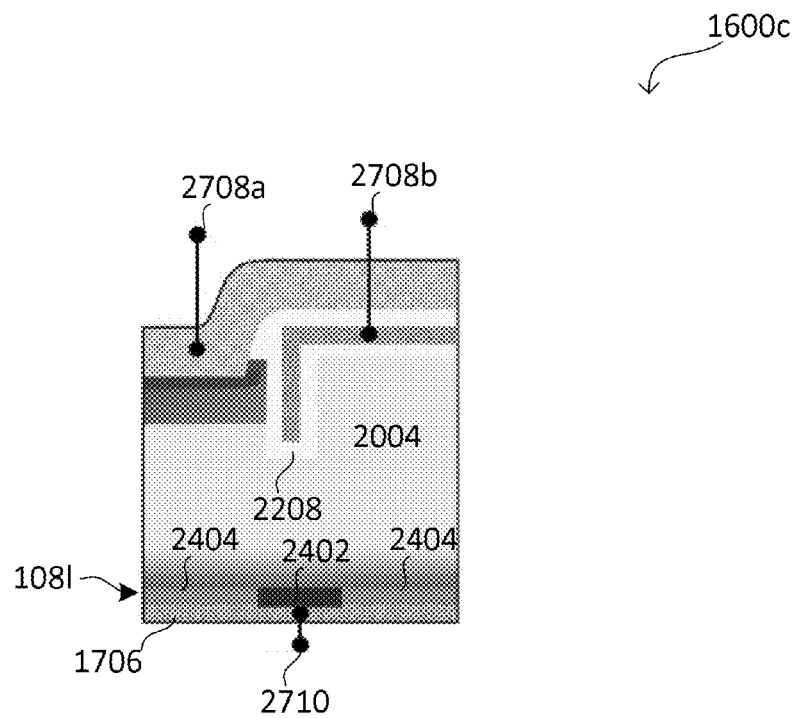

FIG. 16A, FIG. 16B and FIG. 16C respectively illustrate a semiconductor device according to various embodiments in a method according to various embodiments in a schematic cross sectional view, e.g. in the schematic cross sectional view 2106v (see FIG. 21).

FIG. 16A illustrates a semiconductor device 1600a having a diode structure, e.g. similar to the semiconductor device 1200b. The second contact pad 1708 (e.g. an anode contact pad 1708) may be electrically connected to a first contact terminal 2708 (e.g. an anode contact terminal 2708). The first doped region 2006 may include or be formed from a highly doped semiconductor region having a first doping type. The doped layer 1081 may include or be formed from a highly doped semiconductor region having a second doping type. The second doped region 2004 may include or be formed from a low doped semiconductor region having the second doping type.

FIG. 16B illustrates a semiconductor device 1600b having a transistor structure, e.g. similar to the semiconductor device 1500b. The first doped region 2006 may include or be formed from a first highly doped semiconductor region 2006a having a first doping type and a second highly doped semiconductor region 2006b having the first doping type, wherein a dopant concentration of the first highly doped semiconductor region 2006a may be higher than of the second highly doped semiconductor region 2006b. The doped layer 1081 may include or be formed from a highly doped semiconductor region having the first doping type. The second doped region 2004 may include or be formed from a low doped semiconductor region having the second doping type. The third doped region 2008 and fourth doped region 2002 respectively the may include or be formed from a highly doped semiconductor region having a second doping type.

FIG. 16C illustrates a semiconductor device 1600c having a transistor structure (e.g. a backward-transistor structure), e.g. similar to the semiconductor device 1500b, wherein the doped layer 1081 includes at least one first segment 2402

(e.g. a plurality of first segments 2402) disposed between two second segments 2404 (e.g. of a plurality of second segments). The first segment 2402 (e.g. the plurality of first segments) may include or be formed from highly doped semiconductor region having the second doping type (e.g. different from the doping type of the second doped region 2004). The two second segments 2404 (e.g. the plurality of second segments) may include or be formed from highly doped semiconductor region having the first doping type (e.g. equal to the doping type of the second doped region 2004). The segments of the plurality of first segments and the segments of the plurality of second segments may be disposed in an alternating order, e.g. adjacent to each other.

Figure 17A:
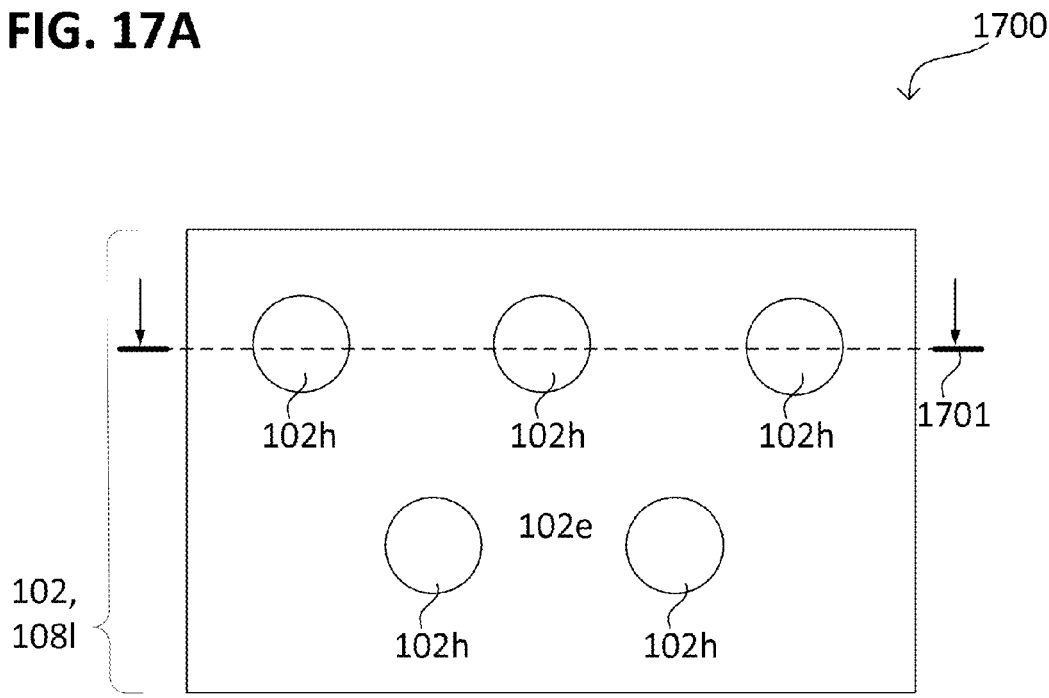
FIG. 17A and FIG. 17B respectively show a semiconductor device according to various embodiments in a method according to various embodiments.
Figure 17B:
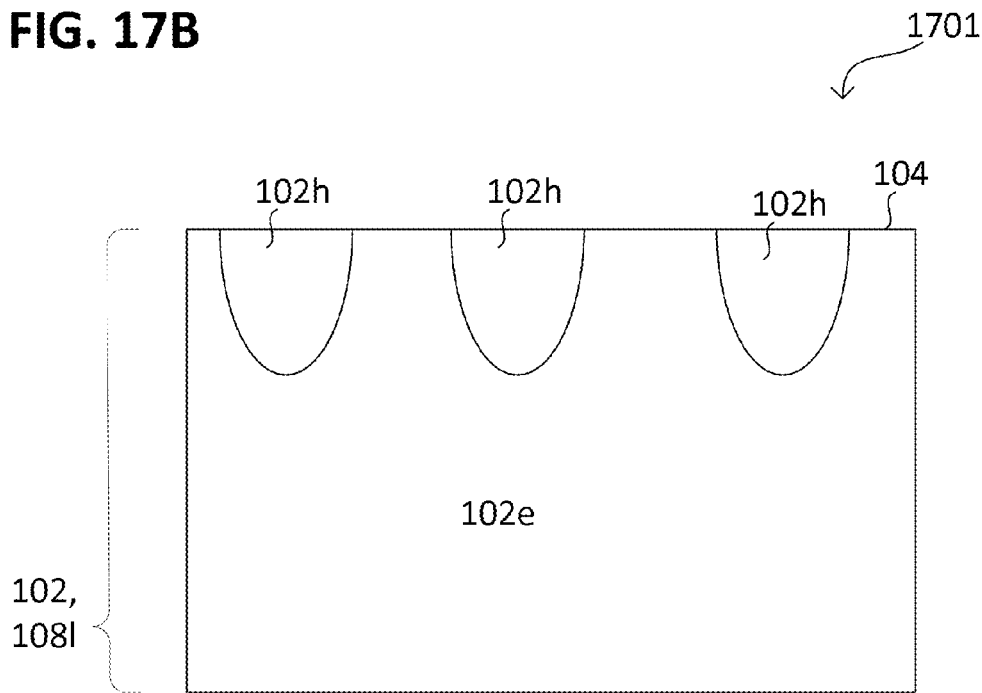

FIG. 17A illustrates a semiconductor device 1700 according to various embodiments according to various embodiments in a schematic first cross sectional view (e.g. parallel to the macroscopic surface normal, or a respective top view) and FIG. 17B illustrates the semiconductor device 1700 in in a schematic second cross sectional view 1701 (or a respective side view) perpendicular to the first cross sectional view.

The semiconductor device may include or be formed from a semiconductor region 102. The semiconductor region 102 may include a surface 102 and a first portion 102e adjacent the surface 104. The first portion 102e may include the dopant. For example, the first portion 102e may be part of the doped layer 1081.

Further, the semiconductor region 102 may include a plurality of second portions 102h adjacent the surface. Each portion of the plurality of second portions 102h may include the dopant. For example, the plurality of second portions 102h may be part of the doped layer 1081.

Each portion of the plurality of second portions 102h may be embedded in the first portion 102e. In other words, each portion of the plurality of second portions 102h may be at least partially surrounded by the first portion 102e (e.g. only excluding the surface 104). The plurality of second portions 102h may be separated from each other (e.g. disjoint). In other words, the adjacent portions of the plurality of second portions 102h may be disposed distant from each other.

According to various embodiments, the first portion 102e may include or be formed from a less activated dopant than each portion of the plurality of second portions 102h. An electrical conductivity of the first portion 102h may be less than (e.g. about 75% of, e.g. about 50% of, e.g. about 25% of) an electrical conductivity of each portion of the plurality of second portions 102h. Illustratively, the plurality of second portions 102h may be in physical contact with the at least one carbon allotrope 712 of the radiation absorption layer during irradiation. Therefore, the thermal energy may be transferred form the carbon allotropes 712 of the radiation absorption layer into the semiconductor region 102 through the plurality of second portions 102h, resulting in a temperature difference between the plurality of second portions 102h and the first portion 102e (e.g. a temperature of the plurality of second portions 102h may be greater than a temperature of the first portion 102e) during heating the semiconductor region 102. A higher temperature may result in an enhanced activation of the dopant. Illustratively, the configuration (e.g. structure, size, and arrangement) of the plurality of second portions 102h may be a fingerprint of the carbon allotropes 712 of the radiation absorption layer.

Further, preferred embodiments will be described in the following:

According to various embodiments, a method may include: disposing a dopant in the semiconductor region (e.g. through a surface of the semiconductor region); forming a radiation absorption layer including or formed from at least one allotrope of carbon over at least a portion of the semiconductor region (e.g., over one or more portions of the semiconductor region or over the complete semiconductor region); and activating the dopant at least partially by irradiating the radiation absorption layer at least partially with electromagnetic radiation to heat the semiconductor region at least partially.

According to various embodiments, a method may include: disposing a dopant in the semiconductor region at a first side of the semiconductor region; forming a radiation absorption layer over at least a portion of the semiconductor region at the first side of the semiconductor region; and activating the dopant at least partially by irradiating the radiation absorption layer at least partially with electromagnetic radiation to heat at least a portion of the semiconductor region at the first side of the semiconductor region; and forming a doped region at least one of over or in the semiconductor region at a second side of the semiconductor region opposite the first side, wherein the doped region may include or be formed from a doping type different than the dopant to form a power semiconductor circuit element comprising the dopant and the doped region.

According to various embodiments, the electromagnetic radiation may include or be formed from at least one discrete wavelength.

According to various embodiments, the electromagnetic radiation may include or be formed from laser radiation.

According to various embodiments, the electromagnetic radiation may include or be formed from pulsed electromagnetic radiation.

According to various embodiments, heating the semiconductor region may include or be formed from a thermal non-equilibrium heating process.

According to various embodiments, the electromagnetic radiation may include or be formed from non-thermally formed (in other words, non-thermally generated) electromagnetic radiation.

According to various embodiments, substantially only at least one of the surface of the semiconductor region or a side of the semiconductor region (e.g. on which the radiation absorption layer is disposed) may be heated, e.g. to at least a dopant-activation temperature.

According to various embodiments, a temperature gradient in the semiconductor region may be formed by heating the semiconductor region.

According to various embodiments, the temperature gradient may point to the radiation absorption layer.

According to various embodiments, the semiconductor region may be heated substantially only via the radiation absorption layer, e.g. to more or equal to the dopant-activation temperature.

According to various embodiments, the dopant-activation temperature may be greater than about 400° C., e.g. at least about 600° C., e.g. at least about 800° C., e.g. at least about 900° C.

According to various embodiments, a temperature gradient of at least 200 K/μm may be formed in the semiconductor region by irradiating the radiation absorption layer.

According to various embodiments, the temperature gradient may point to the radiation absorption layer.

According to various embodiments, the electromagnetic radiation may include or be formed from at least one of pulsed radiation, polarized radiation, at least one discrete wavelength and coherent radiation.

According to various embodiments, the radiation absorption layer may be configured to absorb the electromagnetic radiation substantially completely.

According to various embodiments, the thermal non-equilibrium heating process may include forming a temperature gradient in the semiconductor region.

According to various embodiments, substantially only the surface of the semiconductor region proximate the radiation absorption layer may be heated (e.g. at least within a heating depth).

According to various embodiments, the semiconductor region may be heated only via the radiation absorption layer. In other words, the semiconductor region may be heated substantially only through the radiation absorption layer. In still other words, energy used for heating may enter the semiconductor region substantially only through the radiation absorption layer.

According to various embodiments, the method may further include forming a doped region (e.g. a doped semiconductor region) at least one of over or in the semiconductor region at a side (of the semiconductor region) opposite the dopant in the semiconductor region (in other words, at a second side opposite a first side or the respective surface of the semiconductor region through which the dopant is disposed, e.g. at a side opposite the radiation absorption layer or at a second side opposite a first side of the semiconductor region where the radiation absorption layer is formed or removed from), wherein the doped region includes a doping type different than the dopant to form a power semiconductor circuit element including the dopant and the doped region.

According to various embodiments, the method may further include forming a doped region at least one of over or in the semiconductor region at a side of the semiconductor region opposite a surface of the semiconductor region through which the dopant is disposed in the semiconductor region, wherein the doped region includes a doping type different than the dopant to form a power semiconductor circuit element comprising the dopant and the doped region.

According to various embodiments, the doped region may include or be formed from at least one of the following: a drift region, an emitter region, a junction region.

According to various embodiments, the doped region may be part of a diode structure, e.g. a vertical diode structure.

According to various embodiments, the doped region may be part of a transistor structure, e.g. a vertical transistor structure.

According to various embodiments, the method may further include forming an opaque layer over the semiconductor region after activating the dopant.

According to various embodiments, the opaque layer may be electrically conducting.

According to various embodiments, the opaque layer may include or be formed from a metal.

According to various embodiments, the radiation absorption layer may be structured such that a first reflection characteristic of a first region of the radiation absorption layer is different from a second reflection characteristic of a second region of the radiation absorption layer (e.g. for a certain wavelength or range of wavelengths). In other words, the radiation absorption layer may include or be formed from two regions differing in their reflectance characteristic from each other, e.g. regarding the electromagnetic radiation.

According to various embodiments, the radiation absorption layer may be structured by at least one of: a lift-off process, chemical processing, electrochemical processing and mechanical processing. In other words, structuring the radiation absorption layer may include or be formed from at least one processing of the following processing types: a lift-off process, chemical processing, electrochemical processing or mechanical processing.

According to various embodiments, the radiation absorption layer may be structured by a lift-off process using a mask.

According to various embodiments, the radiation absorption layer may include or be formed from a plurality of protrusions.

According to various embodiments, the radiation absorption layer may include or be formed from at least one of the following types of carbon allotropes: single-walled carbon nanotubes, multi-walled carbon nanotubes, graphite, fullerenes and carbon nanofoam.

According to various embodiments, the radiation absorption layer may include or be formed from a plurality of carbon nanotubes.

According to various embodiments, the plurality of carbon nanotubes may extend into a direction away from the semiconductor region, e.g. into a macroscopic surface normal of the semiconductor region.

According to various embodiments, the radiation absorption layer may include at least one opening, e.g. a plurality of openings, partially exposing the semiconductor region.

According to various embodiments, the radiation absorption layer may include a plurality of separated segments.

According to various embodiments, the radiation absorption layer may be structured using a mask for adjusting a spatial distribution of a reflectance of the radiation absorption layer.

According to various embodiments, the radiation absorption layer may be heated to a temperature less than an evaporation temperature of the semiconductor region during activating the dopant.

According to various embodiments, the forming the radiation absorption layer may include forming a catalyst layer over the semiconductor region; and exposing the catalyst layer to a gaseous precursor including carbon, wherein the catalyst layer may be configured to crack the gaseous precursor to form the radiation absorption layer using the carbon.

According to various embodiments, the gaseous precursor may include or be formed from organic molecules.

According to various embodiments, the catalyst layer may include or be formed from a catalyst metal.

According to various embodiments, the catalyst layer may include or be formed from a plurality of islands separated from each other.

According to various embodiments, the electromagnetic radiation may include or be formed from radiation in the range from ultraviolet radiation to infrared radiation. In other words, the electromagnetic radiation may also include at least one of ultraviolet radiation, visible radiation or infrared radiation.

According to various embodiments, the electromagnetic radiation may include or be formed from ultraviolet radiation. Alternatively or additionally, the electromagnetic radiation may include or be formed from infrared radiation. Alternatively or additionally, the electromagnetic radiation may include or be formed from visible radiation.

According to various embodiments, the electromagnetic radiation may include or be formed from a discrete spectrum (radiation having one or more discrete wavelengths).

According to various embodiments, disposing the dopant may include implanting ions into the semiconductor region (e.g. by irradiating the semiconductor region with the ions), wherein the ions may include or be formed from the dopant (also referred to as doping ions). In other words, disposing a dopant may include implanting dopant ions into the semiconductor region to form a layer including the dopant in the semiconductor region.

According to various embodiments, disposing the dopant may include forming a layer including the dopant over the semiconductor region and activating a thermal induced diffusion of the dopant from the layer into the semiconductor region.

According to various embodiments, disposing the dopant may include exposing the semiconductor region to a gas including the dopant.

According to various embodiments, activating the dopant may include increasing the electrical conductivity of a doped layer of the semiconductor region.

According to various embodiments, activating the dopant may include or be formed from incorporating the dopant at least partially into a lattice structure of the semiconductor region.

According to various embodiments, activating the dopant may include or be formed from at least partially recrystallizing the semiconductor region (e.g. at least a portion of the semiconductor region in which the dopant is disposed).

According to various embodiments, during the activating of the dopant the semiconductor region is at least partially (e.g. at least the surface portion) heated to a temperature less than a melting temperature of the semiconductor region.

According to various embodiments, during the activating of the dopant, the semiconductor region is at least partially heated (e.g. at least the surface portion) to a temperature less than a melting temperature of the semiconductor region, e.g. to a temperature of at least about 70% of a melting temperature of the semiconductor region, e.g. of at least about 80% of a melting temperature of the semiconductor region, e.g. of at least about 90% of a melting temperature of the semiconductor region.

According to various embodiments, during the activating of the dopant, the semiconductor region is at least partially (e.g. at least the surface portion) heated to a temperature of at least about 900° C. (more than about 900° C.), e.g. of at least about 1000° C., e.g. of at least about 1100° C., e.g. of at least about 1200° C., e.g. of at least about 1500° C., e.g. of at least about 2000° C.

According to various embodiments, during the activating of the dopant, the semiconductor region is at least partially (e.g. at least the surface portion) heated to a temperature greater than a melting temperature of the semiconductor region, e.g. greater than 110% of the melting temperature of the semiconductor region, e.g. greater than 120% of the melting temperature of the semiconductor region, e.g. greater than 140% of the melting temperature of the semiconductor region, e.g. greater than 160% of the melting temperature of the semiconductor region.

According to various embodiments, during the activating of the dopant, a surface portion of the semiconductor region having a thickness of greater than about 0.4 µm is heated, e.g. to the temperature.

According to various embodiments, irradiating the radiation absorption layer may include using an optical resonator (for forming the electromagnetic radiation), e.g. a laser source. In other words, the electromagnetic radiation may include or be formed from laser light.

According to various embodiments, irradiating the radiation absorption layer may include using a plasma source (for forming the electromagnetic radiation), e.g. a gas-discharge lamp such as a flashtube. The plasma source may be configured to emit electromagnetic radiation having at least one discrete wavelength or having a continuous spectrum.

According to various embodiments, irradiating the radiation absorption layer may include using a power solid-state light source (for forming the electromagnetic radiation), e.g. a power light emission diode (power LED).

According to various embodiments, the plasma source may be driven in a pulsed mode to form the electromagnetic radiation.

According to various embodiments, irradiating the radiation absorption layer may include scanning the radiation absorption layer with the electromagnetic radiation.

According to various embodiments, the electromagnetic radiation may include or be formed from a wavelength in the range from about 250 nm to about 600 nm.

According to various embodiments, the electromagnetic radiation may include or be formed from a wavelength in the range from about 500 nm to 600 nm.

According to various embodiments, the electromagnetic radiation may include or be formed from a wavelength in the range from about 350 nm to 500 nm.

According to various embodiments, the electromagnetic radiation may include or be formed from a wavelength in the range from about 250 nm to 350 nm.

According to various embodiments, the electromagnetic radiation may include or be formed from pulsed electromagnetic radiation.

According to various embodiments, irradiating the radiation absorption layer may include or be formed from laser thermal annealing.

According to various embodiments, the method may further include forming a metallization layer over the semiconductor region after activating of the dopant.

According to various embodiments, the method may further include forming at least one transistor in electrical contact with the doped layer. The transistor may be formed at least one of in or on the semiconductor region.

According to various embodiments, the method may further include forming at least one gate contact pad in electrical contact with the doped layer, e.g. over the semiconductor region.

According to various embodiments, the method may further include forming a plurality of semiconductor circuit elements electrically connected in parallel to each other and in electrical contact with the doped layer.

According to various embodiments, the semiconductor region may include or be formed from a single crystalline semiconductor material.

According to various embodiments, the semiconductor region may include or be formed from a polycrystalline semiconductor material.

According to various embodiments, activating the dopant may include forming a doped layer within the semiconductor region. In other words, during activating the dopant, the doped layer may be formed within the semiconductor region.

According to various embodiments, the doped layer may include the dopant and a material of the semiconductor region.

According to various embodiments, the doped layer may include the dopant activated in the material of the semiconductor region.

According to various embodiments, the doped layer may be adjacent to the surface of the semiconductor region, e.g. adjoining the surface of the semiconductor region.

According to various embodiments, the radiation absorption layer may be configured to provide multiple scattering of the electromagnetic radiation at least one of at or in the radiation absorption layer.

According to various embodiments, the radiation absorption layer may be configured to provide multiple scattering of the electromagnetic radiation incident on the radiation absorption layer.

According to various embodiments, a reflectance (reflection coefficient) of the radiation absorption layer is less than about 0.5 for electromagnetic radiation in the range from about 250 nm to about 600 nm (e.g. in the range from about 250 nm to about 350 nm, in the range from about 350 nm to 500 nm and/or in the range from about 500 nm to 600 nm) and/or incident along a direction of a macroscopic surface normal of the semiconductor region.

According to various embodiments, the reflectance of the radiation absorption layer may be less than about 0.5, e.g. less than about 0.4, e.g. less than about 0.3, e.g. less than about 0.2, e.g. less than about 0.1, e.g. less than about 0.05.

According to various embodiments, the power semiconductor circuit element may include or be formed from at least one transistor structure.

According to various embodiments, the power semiconductor circuit element may include or be formed from a vertical structure.

According to various embodiments, the power semiconductor circuit element may include at least one gate terminal (in other words, one gate terminal or more terminals).

According to various embodiments, the at least one gate terminal may be electrically connected to at least one gate contact pad.

According to various embodiments, the power semiconductor circuit element may include or be formed from a plurality of semiconductor circuit elements connected in parallel to each other.

According to various embodiments, a semiconductor region of a semiconductor device may include: a surface; a first portion adjacent the surface; a plurality of second portions adjacent the surface and embedded in the first portion, wherein the second portions are separated from each other (e.g. disposed disjoint); wherein the first portion comprises a dopant that is activated to a different (e.g., higher or lower) degree than each portion of the plurality of second portions, such that the first portion differs from each portion of the plurality of second portions in at least an electrical conductivity.

According to various embodiments, a semiconductor region of a semiconductor device may include: a surface; a first portion adjacent the surface; a plurality of second portions adjacent the surface and embedded separated from each other (e.g. disposed disjoint) in the first portion; wherein the first portion comprises a less activated dopant than each portion of the plurality of second portions, such that an electrical conductivity of the first portion is less than an electrical conductivity of each portion of the plurality of second portions.

According to various embodiments, a radiation absorption layer including at least one allotrope of carbon (e.g., a layer including or made of carbon nanotubes, graphite, carbon nanofoam, and/or fullerenes) may be formed over one or more areas at a front side or back side of a wafer (more generally, semiconductor region), and subsequently the wafer may be irradiated so as to activate dopant material in the one or more areas of the wafer that are covered by the radiation absorption layer (also referred to as "drive-in"). In one or more embodiments, the one or more areas of the wafer constitute a fraction of the entire front side or back side area of the wafer. In other words, one or more areas at the front side or back side of the wafer may remain uncovered by the radiation absorption layer. In one or more embodiments, irradiating the wafer may include irradiating the entire front side or back side area of the wafer (either sequentially, e.g. by scanning, e.g. laser scanning, or simultaneously, e.g. by exposure), including the one or more areas of the wafer covered by the radiation absorption layer and the one or more areas of the wafer uncovered by the radiation absorption layer. In one or more embodiments, activation of the dopant material by the irradiation occurs substantially only in the one or more areas of the wafer covered by the radiation absorption layer. In one or more embodiments, irradiating the wafer may include irradiating one or more areas of the radiation absorption layer, so as to activate dopant material in one or more areas of the wafer that are covered by the irradiated one or more areas of the radiation absorption layer (also referred to as "drive-in"). In one or more embodiments, the one or more areas of the radiation absorption layer constitute a fraction of the entire radiation absorption layer. In other words, one or more areas of the radiation absorption layer (e.g., at the front side or back side of the wafer) may remain unirradiated.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method comprising:
    disposing a dopant in a semiconductor region;
    forming a radiation absorption layer comprising at least one allotrope of carbon over at least a portion of the semiconductor region;
    activating the dopant at least partially by irradiating the radiation absorption layer at least partially with electromagnetic radiation to heat the semiconductor region at least partially;
    wherein the radiation absorption layer comprises at least one of the following allotropes of carbon: carbon nanotubes, graphite, fullerenes, carbon nanofoam.

2. The method of claim 1,
    wherein the electromagnetic radiation has at least one discrete wavelength.

3. The method of claim 1,
    wherein the semiconductor region is heated substantially only via the radiation absorption layer.

4. The method of claim 1,
    wherein the electromagnetic radiation comprises at least one of pulsed radiation and coherent radiation.

5. The method of claim 1,
    wherein heating the semiconductor region comprises a thermal non-equilibrium heating process.

6. The method of claim 1,
    wherein a reflectance characteristic of the radiation absorption layer regarding the electromagnetic radiation is less than a reflectance characteristic of the semiconductor region regarding the electromagnetic radiation.

7. The method of claim 1, further comprising:
    forming a doped region at least one of over or in the semiconductor region at a side of the semiconductor region opposite a surface of the semiconductor region through which the dopant is disposed in the semiconductor region, wherein the doped region comprises a doping type different than the dopant to form a power semiconductor circuit element comprising the dopant and the doped region.

8. The method of claim 1, wherein the radiation absorption layer comprises two regions differing from each other in their reflectance characteristic regarding the electromagnetic radiation.

9. The method of claim 1, wherein the radiation absorption layer comprises at least one opening partially exposing the semiconductor region.

10. The method of claim 1, wherein the forming the radiation absorption layer comprises:
forming a catalyst layer over the semiconductor region; and
exposing the catalyst layer to a gaseous precursor comprising carbon, wherein the catalyst layer is configured to crack the gaseous precursor to form the radiation absorption layer using the carbon.

11. The method of claim 1, wherein forming the radiation absorption layer comprises using a mask for adjusting a spatial distribution of a reflectance characteristic of the radiation absorption layer.

12. The method of claim 1, wherein the radiation absorption layer is heated to a temperature less than an evaporation temperature of the semiconductor region during activating the dopant.

13. The method of claim 1, wherein irradiating the radiation absorption layer comprises using at least one of an optical resonator, a power solid-state light source and a plasma source.

14. The method of claim 1, further comprising:
forming at least one collector contact pad in electrical contact with the semiconductor region after the activating the dopant.

15. The method of claim 1, wherein the activating the dopant comprises forming a doped layer within the semiconductor region.

16. The method of claim 1, wherein a reflectance of the radiation absorption layer is less than about 0.5 for electromagnetic radiation in the range from about 250 nm to about 600 nm.

17. The method of claim 1, further comprising:
removing the radiation absorption layer after the activating the dopant by at least one of etching and ashing.

18. A method comprising:
disposing a dopant in a semiconductor region at a first side of the semiconductor region;
forming a radiation absorption layer over at least a portion of the semiconductor region at the first side of the semiconductor region; and
activating the dopant at least partially by irradiating the radiation absorption layer at least partially with electromagnetic radiation to heat at least a portion of the semiconductor region at the first side of the semiconductor region; and
forming a doped region at least one of over or in the semiconductor region at a second side of the semiconductor region opposite the first side, wherein the doped region comprises a doping type different than the dopant to form a power semiconductor circuit element comprising the dopant and the doped region.

19. The method of claim 18, wherein the power semiconductor circuit element comprises at least one transistor structure.

20. The method of claim 19, wherein the power semiconductor circuit element comprises a vertical structure.

21. A semiconductor device, comprising a semiconductor region, the semiconductor region comprising:
a surface;
a first portion adjacent the surface;
a plurality of second portions adjacent the surface and embedded in the first portion, wherein the second portions are separated from each other;
wherein the first portion comprises a dopant that is activated to a different degree than each portion of the plurality of second portions, such that the first portion differs from each portion of the plurality of second portions in at least an electrical conductivity.

22. A method comprising:
disposing a dopant in a semiconductor region;
forming a radiation absorption layer comprising at least one allotrope of carbon over at least a portion of the semiconductor region;
activating the dopant at least partially by irradiating the radiation absorption layer at least partially with electromagnetic radiation to heat the semiconductor region at least partially;
wherein the radiation absorption layer comprises two regions differing from each other in their reflectance characteristic regarding the electromagnetic radiation.

23. A method comprising:
disposing a dopant in a semiconductor region;
forming a radiation absorption layer comprising at least one allotrope of carbon over at least a portion of the semiconductor region;
activating the dopant at least partially by irradiating the radiation absorption layer at least partially with electromagnetic radiation to heat the semiconductor region at least partially;
wherein the radiation absorption layer comprises at least one opening partially exposing the semiconductor region.

* * * * *

UNITED STATES PATENT AND TRADEMARK OFFICE
CERTIFICATE OF CORRECTION

PATENT NO. : 9,679,773 B1
APPLICATION NO. : 15/068762
DATED : June 13, 2017
INVENTOR(S) : Manfred Engelhardt Page 1 of 1

It is certified that error appears in the above-identified patent and that said Letters Patent is hereby corrected as shown below:

On the Title Page

Applicant under Item (71): delete "Neuibiberg" and write --Neubiberg-- in place thereof.

In the Claims

Claim 20 - Column 38, Line 15: delete "The method of claim 19" and write --The method of claim 18-- in place thereof.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*